US008945966B2

(12) United States Patent
Francis et al.

(10) Patent No.: US 8,945,966 B2
(45) Date of Patent: Feb. 3, 2015

(54) METHOD FOR MANUFACTURING SEMICONDUCTOR DEVICES HAVING GALLIUM NITRIDE EPILAYERS ON DIAMOND SUBSTRATES USING INTERMEDIATE NUCLEATING LAYER

(75) Inventors: Daniel Francis, Oakland, CA (US); Felix Ejeckam, San Francisco, CA (US); John Wasserbauer, San Leandro, CA (US); Dubravko Babic, San Jose, CA (US)

(73) Assignee: Element Six Technologies US Corporation, Santa Clara, CA (US)

( * ) Notice: Subject to any disclaimer, the term of this patent is extended or adjusted under 35 U.S.C. 154(b) by 317 days.

(21) Appl. No.: 13/608,902

(22) Filed: Sep. 10, 2012

(65) Prior Publication Data

US 2013/0183798 A1    Jul. 18, 2013

Related U.S. Application Data

(62) Division of application No. 12/569,486, filed on Sep. 29, 2009, now Pat. No. 8,283,189, which is a division of application No. 11/279,553, filed on Apr. 12, 2006, now Pat. No. 7,595,507.

(60) Provisional application No. 60/671,411, filed on Apr. 13, 2005.

(51) Int. Cl.
*H01L 21/00* (2006.01)
*H01L 21/336* (2006.01)
*H01L 21/04* (2006.01)
*H01L 21/02* (2006.01)
*H01L 23/373* (2006.01)
*C30B 7/00* (2006.01)

(52) U.S. Cl.
CPC ...... *H01L 21/0405* (2013.01); *H01L 21/02381* (2013.01); *H01L 21/02447* (2013.01); *H01L 21/02458* (2013.01); *H01L 21/02488* (2013.01); *H01L 21/02527* (2013.01); *H01L 23/3732* (2013.01); *C30B 7/005* (2013.01)
USPC ............................... 438/46; 438/47; 438/285

(58) Field of Classification Search
USPC ....................................... 438/46, 47, 285, 483
See application file for complete search history.

(56) References Cited

U.S. PATENT DOCUMENTS

| 6,794,276 | B2 * | 9/2004 | Letertre et al. | 438/506 |
|---|---|---|---|---|
| 7,595,507 | B2 * | 9/2009 | Francis et al. | 257/76 |
| 8,283,189 | B2 * | 10/2012 | Francis et al. | 438/26 |
| 8,283,672 | B2 * | 10/2012 | Francis et al. | 257/76 |
| 8,674,405 | B1 * | 3/2014 | Babic et al. | 257/183 |
| 8,759,134 | B2 * | 6/2014 | Ejeckam et al. | 438/46 |
| 2004/0119063 | A1 * | 6/2004 | Guo et al. | 257/13 |

* cited by examiner

*Primary Examiner* — Evan Pert
(74) *Attorney, Agent, or Firm* — Bryan Cave LLP

(57) ABSTRACT

Methods for integrating wide-gap semiconductors with synthetic diamond substrates are disclosed. Diamond substrates are created by depositing synthetic diamond onto a nucleating layer deposited or formed on a layered structure including at least one layer of gallium nitride, aluminum nitride, silicon carbide, or zinc oxide. The resulting structure is a low stress process compatible with wide-gap semiconductor films, and may be processed into optical or high-power electronic devices. The diamond substrates serve as heat sinks or mechanical substrates.

22 Claims, 40 Drawing Sheets

| Materials | Substrate | Device | Bandgap (eV) | $V_{breakdown}$ (MV/cm) | Power Density (W/mm) | $\sigma_{Thermal}$ (W/m-K) |
|---|---|---|---|---|---|---|
| 1st Generation | | | | | | |
| Si | Si | LDMOS | 1.12 | 0.25 | 0.6 | 148 |
| 2nd Generation | | | | | | |
| GaAs | GaAs | MESFET | 1.42 | 0.3 | 0.8 | 55 |
| GaAs | GaAs | HV MESFET | 1.42 | 0.3 | 1.8 | 55 |
| GaAs | GaAs | PHEMT | 1.42 | 0.3 | 0.8 | 55 |
| GaAs | GaAs | HV PHEMT | 1.42 | 0.3 | 2 | 55 |
| 3rd Generation | | | | | | |
| SiC | SiC | MESFET | 3.03 | 2.4 | 5.2 | 340 |
| GaN | Si | HEMT | 3.39 | ~5 | ? | 148 |
| GaN | Sapphire | HEMT | 3.39 | ~5 | 9.4 | 40 |
| GaN | SiC | HEMT | 3.39 | ~5 | ~9-15 | 340 |
| Present Invention | | | | | | |
| GaN | Diamond | HEMT | 3.39 | ~5 | ~15-50 (Est.) | 1200 |

Fig. 3

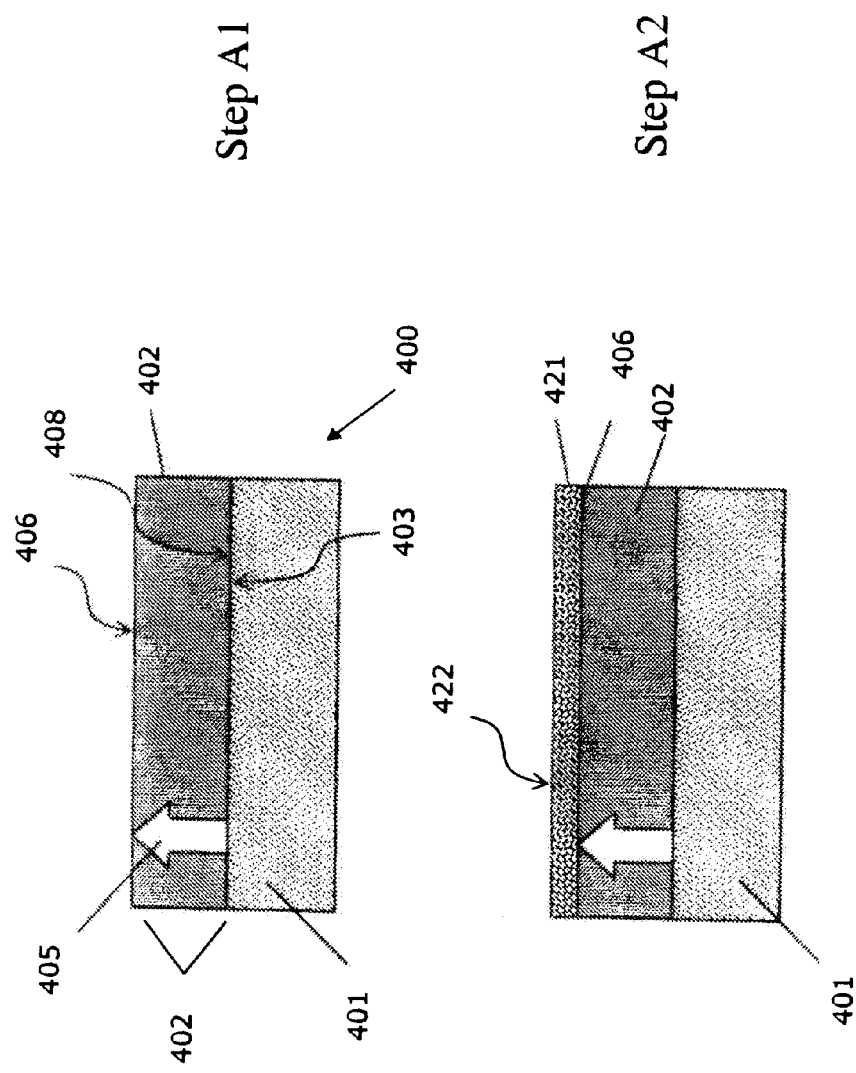

Method A: Reverse EPI, on diamond

Step A4(b)

Method A: Reverse EPI, on diamond

Step A4(c)

Method A: Reverse EPI, on diamond

Step A5

Step A6

Step A7

Method A: Reverse EPI, on diamond

Method B: Reverse EPL, with dummy substrate

Step B3

Step B8

Method B: Reverse EPI with dummy substrate

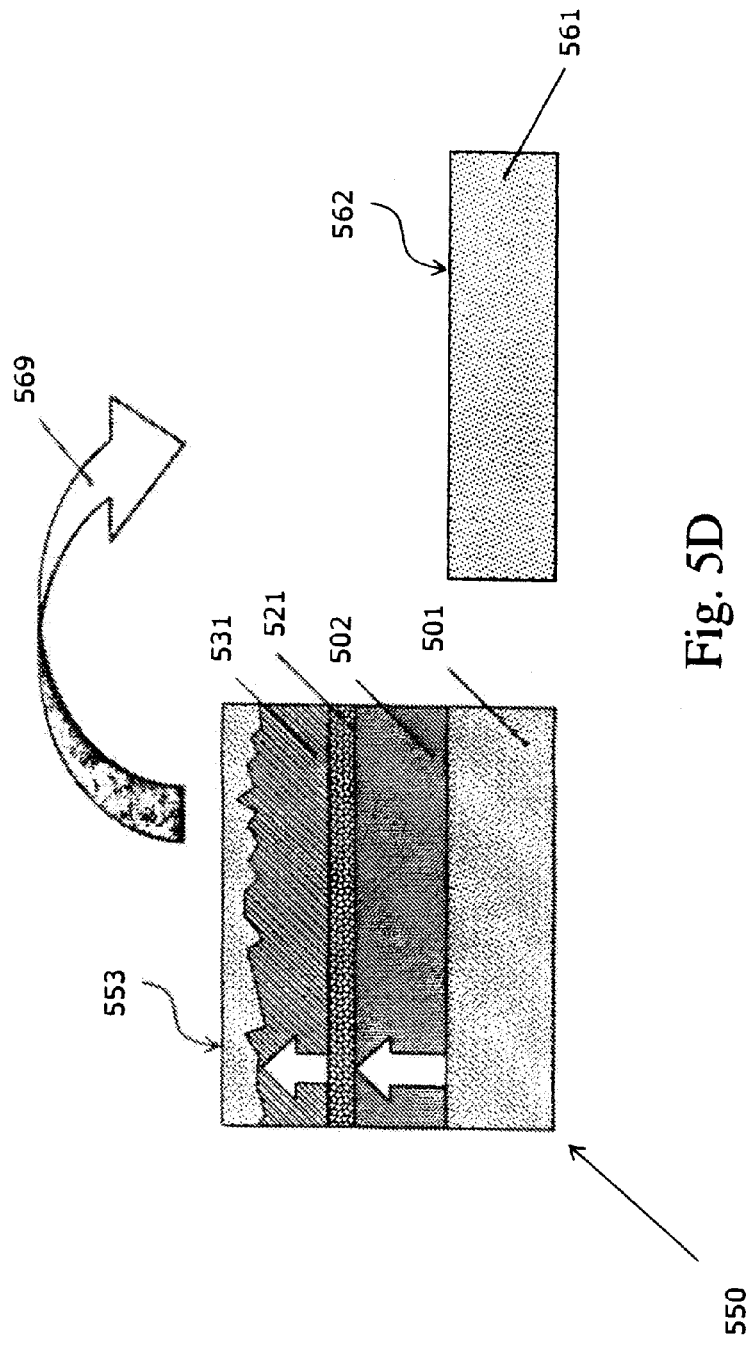

Method B: Reverse EPL, with dummy substrate

Step B7

Step B9

Step B10

Method B: Reverse EPI, with dummy substrate

Method C: As grown EPI, on diamond

Step C2

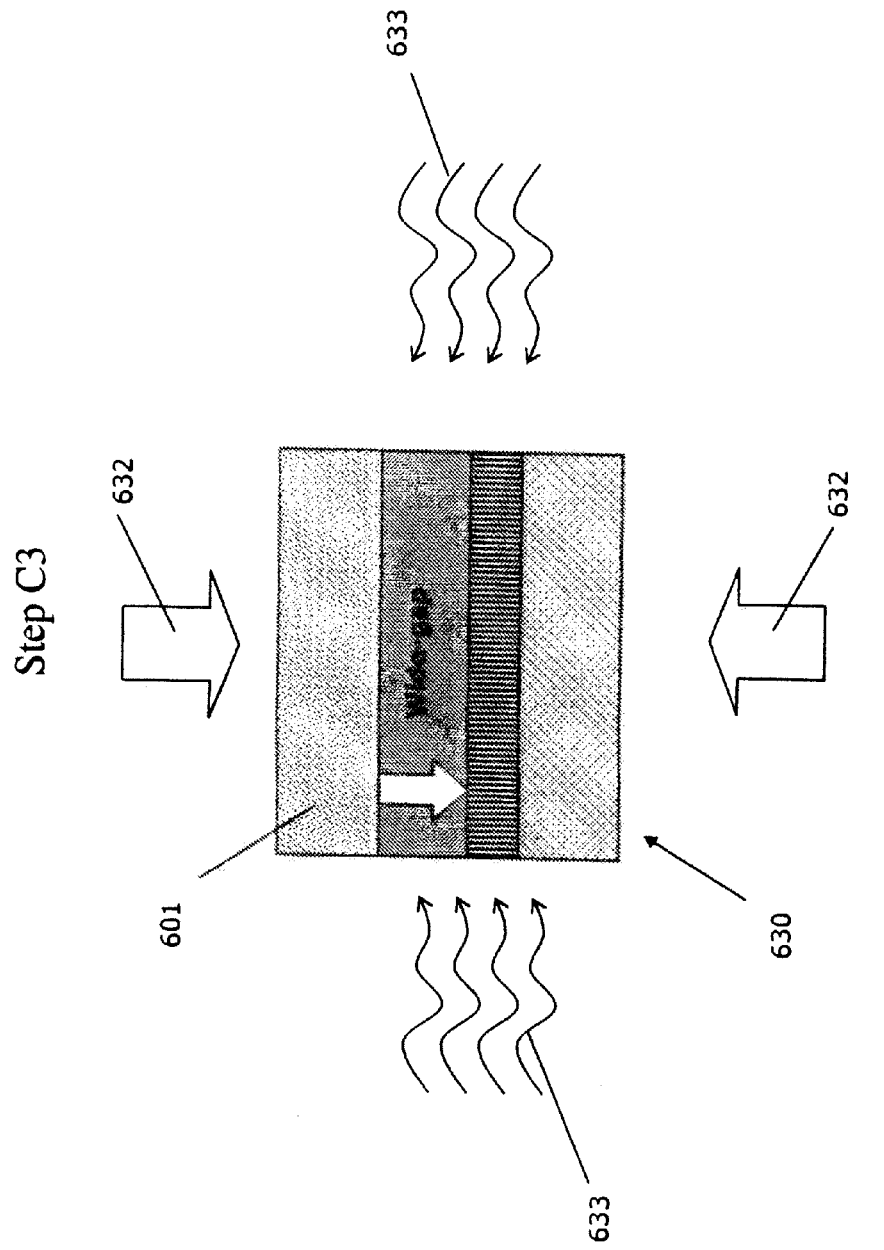

Step C5

Step C6

Method C: As grown EPI, on diamond

Step C7(b)

Step C8

Method C: As grown EPI, on diamond

Step C9

Method C: As grown EPI. on diamond

Step C10

Method D: As grown EPI, on dummy substrate

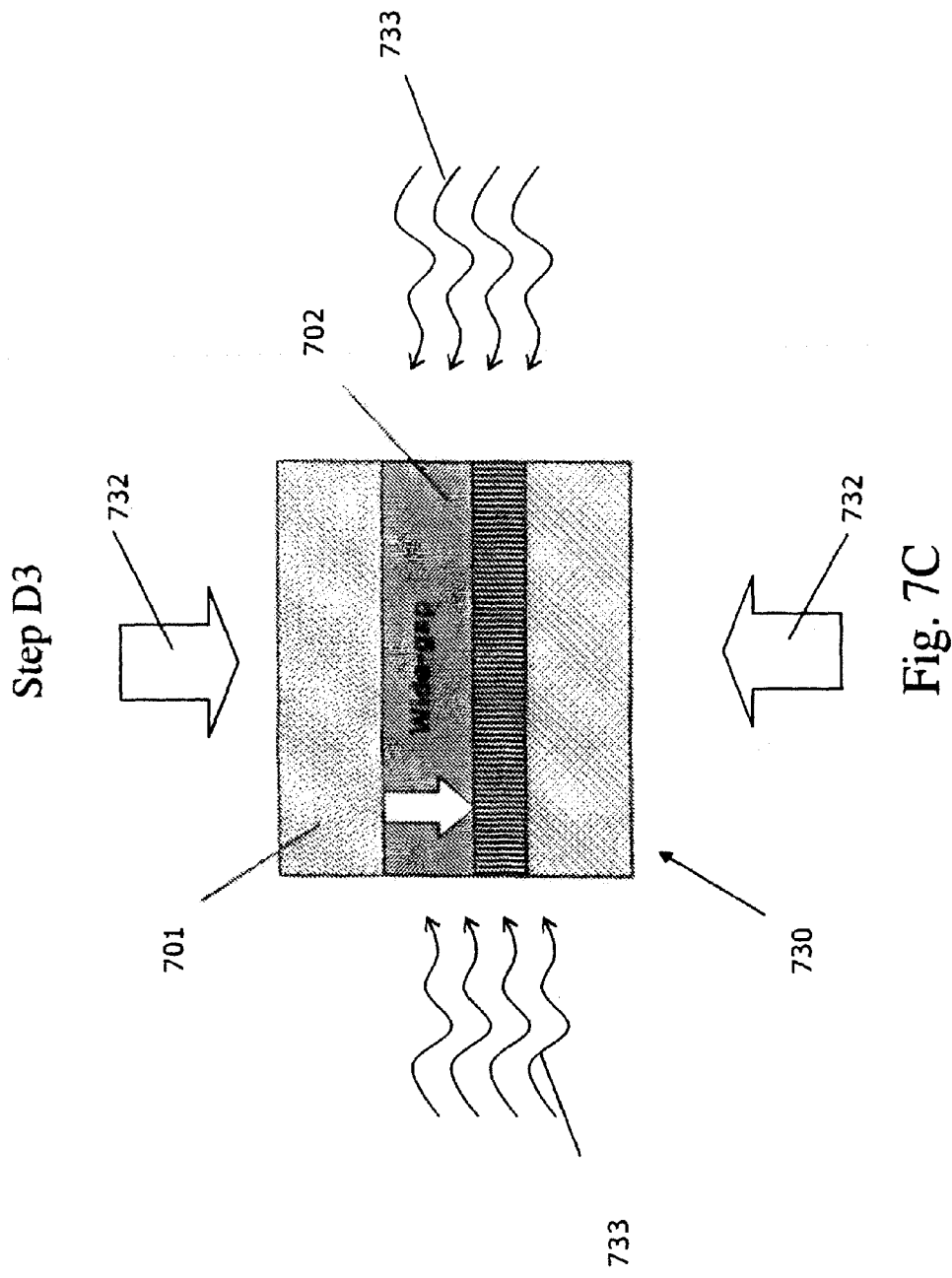

Step D5

Step D6

Method D: As grown EPI. on dummy substrate

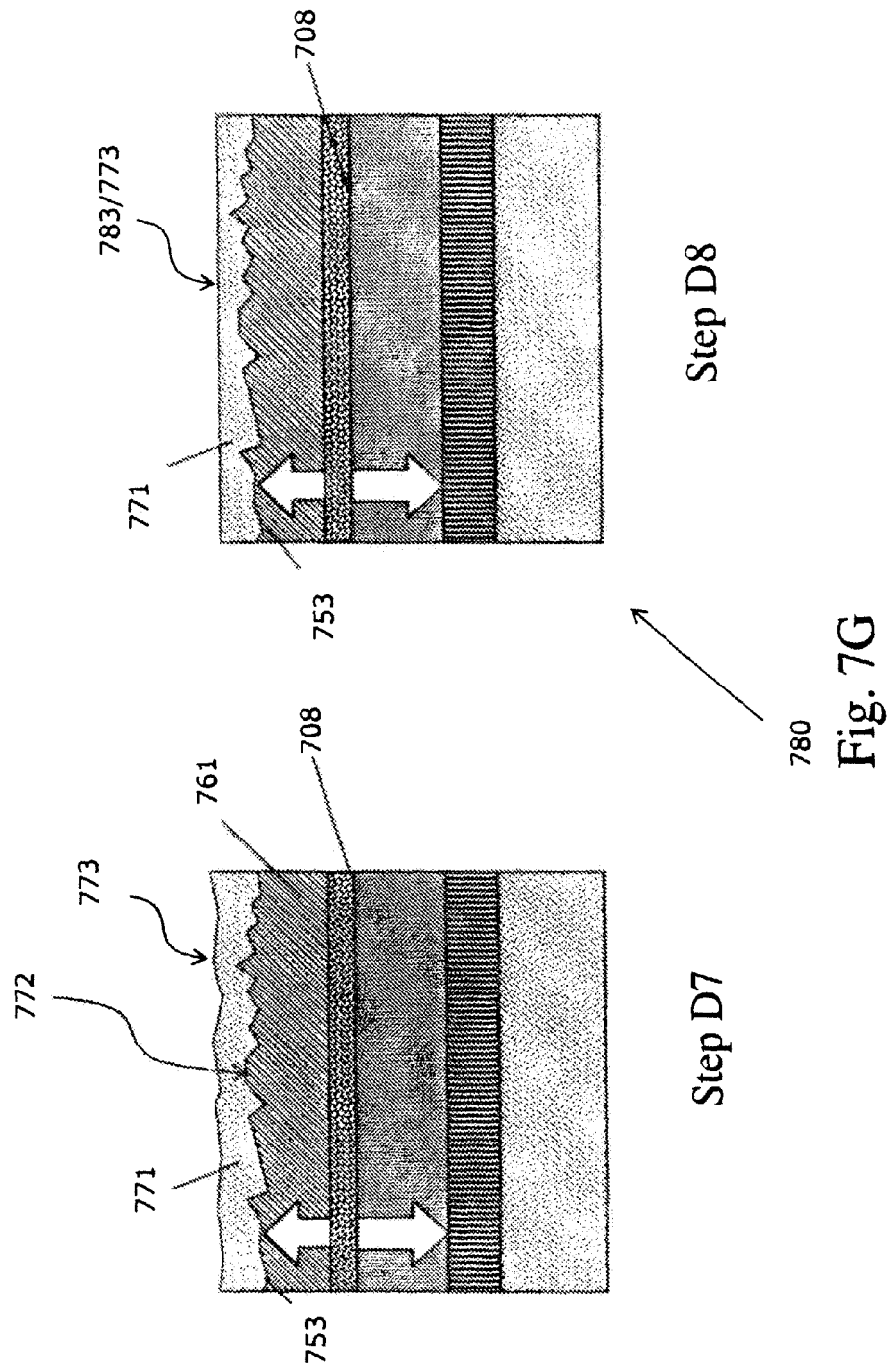

Method D: As grown EPI, on dummy substrate

Step D9

Step D11

Method D: As grown EPI, on dummy substrate

Step D12

Method D: As grown EPI, on dummy substrate

Step D13

Method for Producing a Removable Diamond Substrate Carrier

Step E1

Step E5

Method for Producing a Removable Diamond Substrate Carrier

Method for Producing a Removable Diamond Substrate Carrier

Step E3

Method for Producing a Removable Diamond Substrate Carrier

Step E4

METHOD FOR MANUFACTURING SEMICONDUCTOR DEVICES HAVING GALLIUM NITRIDE EPILAYERS ON DIAMOND SUBSTRATES USING INTERMEDIATE NUCLEATING LAYER

CROSS REFERENCE TO RELATED APPLICATIONS

This application is a divisional of U.S. patent application Ser. No. 12/569,486, filed Sep. 29, 2009, now U.S. Pat. No. 8,283,189 which is a divisional of U.S. patent application Ser. No. 11/279,553 filed Apr. 12, 2006, now U.S. Pat. No. 7,595,507 which claims priority from U.S. Provisional Patent Application Ser. No. 60/671,411 filed Apr. 13, 2005.

FIELD OF THE INVENTION

The present invention relates to high-power electronic and optoelectronic devices and methods for fabricating the same, and thermal management of electronic devices. The invention teaches methods for fabricating such devices including synthetic diamond films as well as their use with wide-gap semiconductors such as gallium nitride-based electronic and optoelectronic devices, including high-electron mobility transistors, radio-frequency (RF) electronic devices, light-emitting diodes, and lasers.

BACKGROUND OF THE INVENTION

Thermal management in semiconductor devices and circuits is a critical design element in any manufacturable and cost-effective electronic and optoelectronic product, such as light generation and electrical signal amplification. The goal of efficient thermal design is to lower the operating temperature of such electronic or optoelectronic devices while maximizing performance (power and speed) and reliability. Examples of such devices are microwave transistors, light-emitting diodes and lasers. Until recently, these devices have been manufactured from silicon, gallium arsenide (GaAs) and indium phosphide (InP). In recent years, gallium nitride (GaN), aluminum nitride (AlN) and other wide-gap semiconductors have surfaced as new choices for both power electronics and visible-light generating optoelectronics. For example, gallium nitride is a wide-gap semiconductor that is used today for visible light-emitting diodes and lasers and for high-power microwave transistors.

The gallium nitride material system gives rise to microwave transistors with high-electron mobility (necessary for high-speed operation), high breakdown voltage (necessary for high power), and thermal conductivity that is greater than GaAs, InP, or silicon, and thus suitable for use in high power applications. GaN is also manufactured at temperatures closer to those used in silicon processing (~1000° C.). Recently, growth of GaN on silicon has been demonstrated and investigated.

The most investigated gallium-nitride high-power transistor structure is that of the high-electron mobility transistor (HEMT), illustrated in FIG. 1. This transistor comprises a substrate 102 on top of which a layered structure 101 is grown. The layered structure 101 comprises GaN 104 and AlGaN 105 layers on top of which electrical contacts 110, 111, and 107 are deposited. These contacts serve in the operation of the HEMT. Since GaN is a single crystal with a lattice constant that is different from the substrate, it is often necessary to grow several layers to accommodate for the lattice constant change and absorb the dislocations. These layers are collectively referred to as the buffer layer 103, and typically comprise AlN or a combination of GaN and AlN. In the GaN layers 104, close to the semiconductor junction between AlGaN 105 and GaN 104, a layer referred to as the two-dimensional electron gas (2DEG) 108 is formed. Its formation is both an electrostatic and quantum-mechanical phenomenon. The electrons in this thin layer have very high mobility and carry current from the source 110 to the drain 107. This current path is commonly referred to as the channel. The density of the electrons in the channel determines the resistance between the source and the drain and is controlled with the voltage on the gate terminal 111. Finally, using a small voltage applied to the gate terminal 111 one can control very large currents in the channel 108 this is the fundamental requirement for current and power amplification in electronic devices.

Because GaN devices offer high current density and high voltage operation, they exhibit larger total power losses due to parasitic resistances and the inefficiency inherent to the amplification process. Most of heat dissipation in the exemplary device shown in FIG. 1 occurs along the channel 108 and underneath the contacts (source 110 and drain 107). Efficient removal of this heat is essential to making practical GaN HEMTs. However, prior art GaN devices have used substrates that have drawbacks negatively impacting device microwave and/or thermal performance or price. Examples of such substrates are silicon, sapphire and silicon carbide.

Gallium nitride devices have also been investigated for light-emitting diodes for solid-state illumination as well as for medical and environmental laser applications. In all of these applications, heat removal is typically accomplished by placing the electronic device, optical device or integrated circuit as close as possible to a heat sink. A heat sink is a substance or device for the absorption or dissipation of unwanted heat (as from a process or an electronic device). Most often, the heat sinks are copper blocks attached to a water-cooling system, aluminum fins, or a micro-channel cooler. Diamond heat sinks are being actively investigated because of the superior thermal properties of diamond. However, because of the material and process temperature incompatibility, only bonding or die attach methods have been investigated. Conventional heat removal systems for transistors and light-emitting devices (based on bonding and attaching devices to heat sinks) are typically large in comparison with the heat source in the electronic chip or individual device and offer limited thermal performance improvement.

There has therefore been a need for devices, systems and structures that can combine the thermal and other advantages of diamond substrates with wide-gap semiconductors, particularly gallium nitride, aluminum nitride or similar films, and for methods for manufacturing the same.

SUMMARY OF THE INVENTION

It is helpful to discuss physical quantities related to surface quality. Surface quality has been found to be important for thermal contact and bonding processes that are used as steps in the preferred methods. A surface is a boundary that separates an object from another object or substance. A surface form is the intended surface shape. For example, a silicon wafer used in semiconductor industry has a flat surface form. A real surface deviates from the surface form due to manufacturing imperfections and external forces. For this reason, substantial effort has been spent in the industry to characterize the mechanical imperfections of surfaces. The parameters relevant for this work are surface roughness and surface bow, more fully explained below.

Every real surface discussed is finite (has boundaries) and has a central plane. A central plane is an imaginary plane that can be defined for any finite surface in the following way: if the distance of every point on a surface is measured relative to an arbitrary reference plane, then the central plane is obtained by linear regression of the collected two-dimensional data. Namely, the average of all of the distances between each point on the surface to the central plane equals zero. A surface profile is the set of data points indicating the distance from the surface to the central plane. The phrase "surface profile" may be used for both one-dimensional and two-dimensional profiles. Measurements performed on real surfaces are typically performed over areas that are smaller than the entire surface. For example, the surface roughness may be evaluated over a rectangular area with several micrometers on each side, while the surface (or wafer) bow may be evaluated over an area that is almost as large as the wafer (the entire surface). The area or distance over which a certain surface profile parameter is evaluated is referred to as the "evaluation area."

A profiling method is a means of measuring a profile of a surface. The result of the method is a one- or two-dimensional graph of the shape of the surface over an evaluation distance or area. The most common type of profiling instrument draws a stylus across the surface and measures its vertical displacement as a function of position. In the last decade, the atomic force microscope has been used for characterizing surfaces on the nanometer scale.

As used herein, surface roughness will refer to rms surface roughness $\sigma$, which is defined as the square root of the variance of the surface height $z(x, y)$ over the central plane. Here z is the distance between the surface and the central plane at a location on the central plane defined by coordinates x and y:

$$\sigma^2 = \frac{1}{A} \int\int_A (z(x, y) - \bar{z})^2 dx\, dy \quad \bar{z} = \frac{1}{A} \int\int_A z(x, y) dx\, dy$$

Here A is the evaluation area, and $\bar{z}$ is the average of the surface distance to the central plane taken on the evaluation area $\Lambda$. The surface bow is defined as the largest deviation in the surface profile encountered on the evaluation area A.

$$B = \text{MAX}[z(x,y)]|_A - \text{MIN}[z(x,y)]$$

One of the origins of surface bow is wafer bowing due to stress introduced by a film deposited on the wafer. For example, a wafer of diameter D may be bowed with a radius of curvature equal to R. Such a wafer has a bow equal to $$B = R \cdot \left(1 - \cos\left(\frac{D}{2R}\right)\right) \approx \frac{D^2}{8R}$$

In state-of-the-art thermal management applications, devices on different wafers are brought into thermal contact. In these applications, the presence of bow and surface roughness may significantly disrupt effective heat conduction.

In a typical synthetic diamond process in accordance with the present invention, a film of diamond (from only a few microns to tens or hundreds of microns) is grown on a substrate. Although the top surface of the substrate can be very smooth, the top surface of the grown diamond layer is rough. If the substrate is a silicon wafer, its rms surface roughness measured over a square evaluation area of 100 $\mu m^2$ may be less than 1 nm. At the same time, the rms surface roughness of the deposited diamond film may be as high as 10% of the grown diamond thickness. The surface roughness of as-grown gallium nitride films measures typically between one and several nanometers.

Among other things, this application discloses several methods for the manufacturing of improved heat spreading and heat conduction layers using synthetic diamond, and use of diamond layers as a mechanical support for electronic and optoelectronic devices, i.e. for a substrate function. The diamond layers are combined with wide-gap semiconductor technology in order to improve the performance of microwave transistors, visible light-emitters, and other related devices.

The term "wide-gap semiconductor technology" is widely used in the industry and it refers to electronic and optoelectronic device and manufacturing technology based on wide-gap semiconductors. In this application, for clarity, "wide-gap semiconductor" means (a) semiconductors comprising a bond between nitrogen (N) and at least one Group III element from the Periodic Table of the Elements (boron, aluminum, gallium, indium, and thallium), (b) semiconductors comprising a bond between carbon (C) and at least one Group IV element from the Periodic Table of the Elements (carbon, silicon, germanium, tin, and lead), or (c) semiconductors comprising a bond between oxygen (O) and at least one Group II element from the Periodic Table of the Elements (eg. beryllium, magnesium, calcium, zinc, cadmium). Specifically, this application applies, but is not limited to, gallium nitride (GaN), aluminum nitride (AlN), indium nitride (InN), aluminum gallium nitride (AlGaN), indium gallium nitride (InGaN), aluminum indium nitride (AlInN), zinc oxide (ZnO), silicon carbide (SiC), and diamond (C). Any of the mentioned materials (a), (b), or (c) may be single-crystal, polycrystalline, or amorphous. Single-crystal means being of one crystal, or having a translational symmetry. This term is common for crystal growth, and is a requirement for most semiconductors. Polycrystalline means consisting of crystals variously oriented or composed of more than one crystal. Amorphous means a material having no real or apparent crystalline form. As is well known in the industry, single crystal wafers and substrates are made using bulk crystal growth techniques resulting in large so called boules, which are then cut to wafer shape. Electronic and optoelectronic devices manufactured out of single-crystal layers of different semiconductor properties are made by different single-crystal growth techniques. It well known in the industry that single-crystal layers for electronic and optoelectronic devices is performed in specially designed machines which enable precise growth of very thin single-crystal semiconductor layers on top of wafers or other thin semiconductor layers. The layers manufactured in such machines are commonly referred to as epitaxial layers and their thickness can vary anywhere from sub-nanometer to tens of micrometers. The machines that make them are referred to as epitaxial growth machines. Examples are Molecular Beam Epitaxy (MBE), Organo-Metallic Vapor-Phase Epitaxy (OMVPE also referred to as MOCVD), and Liquid Phase Epitaxy (LPE).

The present invention offers an improvement over the prior art of making heat-spreading layers by providing a simpler, more reliable method for producing practical heat sinks using synthetic diamond. Synthetic means produced artificially, i.e. not natural, while synthetic diamond means man-made diamond. In the present invention, the diamond films are deposited using a high-temperature process on a nucleating layer or a surface prepared for diamond nucleation that is present on a layer structure that comprises a wide-gap semiconductor. The preferred methods described herein are applicable to wide-gap semiconductors grown on any type of substrate. Typical substrates used for growth of wide-gap semiconductors are sapphire, silicon carbide and silicon. If the substrate is sapphire or silicon carbide whose removal is difficult, the substrate may be removed by chemical lift-off or laser lift-off. If the substrate is silicon, it can be removed by chemical etching or a combination of chemical and mechanical removal, as well known in the art. The exemplary methods disclosed herein take advantage of the combination of the following aspects of synthetic diamond and gallium-nitride-on-silicon technologies: (a) GaN is grown on silicon substrates in order to reduce cost of gallium nitride wafers. (b) Amorphous silicon nitride or amorphous silicon carbide (or both, or other materials mentioned later) are used on a GaN surface as nucleation layers used to nucleate synthetic diamond growth. (c) GaN withstands the 800° C. processing required for diamond deposition, making these synthetic diamond and gallium nitride-based materials compatible from the point of view of processing temperature and temperature cycling. The result of some of the preferred methods described in this application is a freestanding diamond substrate with a gallium nitride layered structure on its top.

Referring more particularly to those aspects of the invention related to heat spreading layers, the present invention meets the essential requirements placed on the spreading materials and the integration technologies to be used in electronic devices, which are: high thermal conductivity, straightforward deposition technology that produces thermal contact with the surrounding materials and structures, and that the materials be electrically insulating. Metals, such as copper and silver, that are excellent thermal conductors, are also electrically conductive and are hence not generally well suited for in-device heat spreading. For example, microwave transistor applications, specifically, require low parasitic capacitances, low cross talk, and low high-frequency losses. For these applications it is critical that the heat spreader layers are insulating and have very low electrical losses at high frequencies.

The present invention proposes the use of synthetic diamond layers to achieve the desired heat spreading for efficient cooling of high-density heat sources. This aspect of the invention is illustrated with the help of FIGS. 2(a)-2(d).

FIG. 2(a) shows a cross-section of an infinitely long stripe structure with a heat source 201 located on top of a stripe chip 203. The chip 203 is mounted on a silicon substrate 202, which is wider than the stripe chip 203. FIG. 2(b) shows a theoretically calculated temperature profile for an infinitely long structure for which the cross-sectional view is schematically illustrated in FIG. 2(a). Since the device is symmetric, only one half is used to calculate the temperature profile. The heat emanates from the heat source 221 (corresponding to heat source 201 in FIG. 2(a)) and is funneled directly down into the substrate 222 (corresponding to silicon substrate 202 in FIG. 2(a)) as shown with the arrows 205. The arrows indicating direction of heat flow are perpendicular to the multiplicity of "isotherms", the curves that connect points with the same temperature. The density of "isotherms" shows relative gradient in temperature. In this calculation, the stripe chip 203 is made out of silicon. For a stripe chip 203 having width and height typically equal to approximately 0.12 mm and approximately 0.15 mm, and substrate 202 thickness typically equal to approximately 0.5 mm, the temperature rise at the heat source is calculated to typically be approximately 0.3° C. for every 1 W/cm of device length.

In FIG. 2(c), the same device structure with heat source 211 is modified by adding a synthetic-diamond spreading layer 214 between the stripe chip 213 and the silicon substrate 212. The thickness of the diamond is approximately 0.1 mm, and the thickness of the silicon substrate is approximately 0.4 mm. The temperature profiles shown in FIG. 2(d) show that substantial heat flow is directed in the lateral direction through the spreading layer 214 as indicated with arrows 215 from the power source 231 towards the substrate 232. For the device (FIG. 2(d)) with the diamond heat spreader 234, the density of isotherms in the stripe chip 235 (also assumed to be made out of silicon) is higher than the density of isotherms in the silicon substrate 226. This increase in density shown in FIG. 2(d) is greater than the increase in isotherm density between the stripe chip 235 and the silicon substrate 226 in the device with no diamond heat spreader. This difference indicates that a comparably smaller temperature drop has been realized in the silicon substrate of device by the use of the diamond heat spreader. The temperature rise in the heat source for approximately every 1 W/cm of device length has been reduced to approximately 0.2° C., a 50% improvement. This is a significant reduction in device temperature that will result in longer life and improved device performance. Diamond is the material with the highest thermal conductivity and is thus most suitable for such applications. In this example, the diamond is approximately 500 um away from the heat source. The diamond layer could also be positioned at different distances, depending upon the implementation, and the closer the diamond is to the heat source, the greater the effect of heat spreading.

This aspect of the invention can be efficiently employed in improving heat spreading in, for example, microwave transistors and light emitting devices. Specifically, this feature and the stripe-heat-source calculation shown in FIG. 2 could typically apply directly to edge-emitting lasers and light-emitting diodes. In the case of light-emitting devices, the heat source 211 and the stripe chip 213 may be a part of a visible super-luminescent diode or a visible laser diode made out of gallium nitride, while the substrate 212 may be made out of silicon or a heat conductive metal. Heat spreading is a concept that is broadly applicable to electronic and optoelectronic devices that need thermal management.

Natural diamond is an excellent thermal conductor, but historically has not been available for these applications due to scarcity and price. The present invention includes the use of synthetic diamond deposited by chemical-vapor deposition (CVD). This material has thermal conductivity similar to that of single crystal diamond. In the CVD process a substrate on top of which synthetic diamond is to be deposited is placed in a vacuum chamber, where methane and hydrogen are introduced and activated using either microwave plasma or tungsten filaments. The typical wafer temperatures are around 800° C. during the deposition process and the deposition rates are measured in micrometers (μm) per hour.

For at least some implementations of the present invention, the growth of synthetic diamond includes a nucleation phase in which conditions are adjusted to enhance the nucleation of diamond on the host substrate. This may be done by scratching the surface with diamond powder or by forming a nucleating layer on top of the surface. Nucleation layer means, in material deposition or crystal growth, a layer that helps start the growth or formation of another layer of material or stochiometry. Examples of preferred nucleating layer materials are amorphous silicon nitride and amorphous silicon carbide. Other amorphous or polycrystalline materials known to aid in the nucleation of synthetic diamond may be used without the departing from the scope of the present invention. Examples are silicon and other wide-gap semiconductor materials. Rather than depositing the nucleation layer in a separate process step, the surface may be prepared for synthetic diamond nucleation by ending the growth of a wide-gap semiconductor layered structure with a layer specifically formed to nucleate synthetic diamond. The choice of materials is a wide-gap semiconductor, such as, aluminum nitrate or silicon carbide, that may be crystalline or polycrystalline. In this latter embodiment, no additional deposition of a nucleating layer is necessary as the surface on which synthetic diamond is to be grown has then been prepared for nucleation. An improper choice of nucleating film may result in highly stressed films. Additionally, during the growth phase, the grain size of synthetic diamond increases and as a result synthetic diamond films are inherently rough after deposition.

Another aspect of the present invention is that the processes disclosed herein solves several of the key problems which have prevented use of synthetic diamond in the past: (a) diamond deposition is a high process temperature (approximately 800° C.) that is incompatible with most compound semiconductor processes used in high-frequency and optical applications (gallium arsenide and indium phosphide decompose at approximately 600° C.); (b) for the same reason, synthetic diamond deposition is also incompatible with most metals used in semiconductor industry; and (c) synthetic diamond is polycrystalline and hence not compatible with any of the single-crystal growing techniques for growing compound semiconductors. For these reasons, integration of diamond heat sinks with devices and circuits has been done exclusively by bonding or die attachment methods. The present invention provides the first structures and methods for successfully fabricating gallium nitride layers with diamond heat sinks. Bonding means to cause to adhere firmly; to hold together in a molecule or crystal by chemical bonds; to hold together or solidify by or as if by means of a bond or binder. This process is commonly used in the semiconductor technology.

This invention discloses several methods in which the combination of wide-gap semiconductor epitaxial films (for example, gallium nitride, aluminum nitride or silicon carbide) with synthetic diamond films is straightforward and scalable to large wafers.

In a first implementation of the method of the invention, referred to herein as Method A, a silicon wafer with a layered structure comprising wide-gap semiconductors is provided. The layered structure is manufactured by epitaxial growth. The surface of the layered structure is prepared for nucleating the growth (or deposition) of synthetic diamond, and synthetic diamond is deposited onto the nucleating layer (or nucleating surface). The silicon wafer is removed and the new structure exhibits a layered structure comprising wide-gap semiconductors mounted on a diamond substrate. This substrate can now be further processed to manufacture electronic or optical devices and circuits. This manufacturing method may also include etching some layers from the layered structure and may also include additional crystal growth of wide-gap semiconductors.

In the second method—referred to as Method B, a first silicon wafer with a layered structure comprising wide-gap semiconductors is provided. The layered structure is manufactured by epitaxial growth. The surface of the layered structure is prepared for nucleating the growth (or deposition) of synthetic diamond, and synthetic diamond is deposited onto the nucleating layer (or nucleating surface). The structure is flipped and mounted onto a second wafer using polysilicon as a bonding layer. The second wafer may be made out of silicon, silicon carbide, glass, or any other material commonly used in the semiconductor industry. The first silicon wafer is removed and the new structure exhibits a layered structure comprising wide-gap semiconductors mounted on a diamond substrate, which is in turn supported by the second wafer. This entire structure can now be further processed to manufacture electronic or optical devices and circuits. This manufacturing method may also include etching some layers from the layered structure and may also include additional crystal growth of wide-gap semiconductors.

In the third method—referred to as Method C, a first silicon wafer with a layered structure comprising wide-gap semiconductors is provided. The layered structure is manufactured by epitaxial growth. A second wafer is provided and an adhesive layer is deposited on either the layered structure surface or the second wafer or both. The first silicon and second wafers are bonded so that the layered structure containing at least one gallium nitride layer is sandwiched between the two wafers. The second wafer may be made out of silicon, silicon carbide, glass, or any other material commonly used in the semiconductor industry. The first wafer is removed, revealing the back surface of the layered structure. The revealed back surface of the layered structure is prepared for nucleating the growth (or deposition) of synthetic diamond, and synthetic diamond is deposited onto the nucleating layer (or nucleating surface). The second wafer is removed and the new structure exhibits a layered structure comprising wide-gap semiconductors mounted on a diamond substrate. This substrate can now be further processed to manufacture electronic or optical devices and circuits. This manufacturing method may also include etching some layers from the layered structure and additional crystal growth of wide-gap semiconductors.

In the fourth method—referred to as Method D, a first silicon wafer with a layered structure comprising wide-gap semiconductors is provided. The layered structure is manufactured by epitaxial growth. A second wafer is provided and an adhesive layer is deposited on either the layered structure surface or the second wafer or both. The first silicon and second wafers are bonded so that said layered structure is sandwiched between the two wafers. The second wafer may be made out of silicon, silicon carbide, glass, or any other material commonly used in the semiconductor industry. The first silicon wafer is removed, revealing the back surface of the layered structure. The revealed back surface of the layered structure is prepared for nucleating the growth (or deposition) of synthetic diamond, and synthetic diamond is deposited onto the nucleating layer (or nucleating surface). The structure is flipped and mounted onto a third wafer using, for example, polysilicon as a bonding layer. The third wafer may be made out of silicon, silicon carbide, glass, or any other material commonly used in the semiconductor industry. The second wafer is removed and the new structure exhibits a layered structure comprising wide-gap semiconductors mounted on a diamond substrate, in turn supported by the third wafer. This structure can now be further processed to manufacture electronic or optical devices and circuits. This manufacturing method may also include etching some layers from the layered structure and additional crystal growth of wide-gap semiconductors.

In one embodiment of the abovementioned preferred methods (A, B, C, and D), the layered structure comprises at least one layer made out of gallium nitride, and in another embodiment, the layered structure comprises at least one layer made out of aluminum nitride. In yet another embodiment, the layered structure comprises at least one layer made out of silicon carbide. In another embodiment, the layered structure comprises at least one layer made out of ZnO.

One of the differences between preferred methods A and B on one hand and the preferred methods C and D on the other is the difference in the growth direction of the layered structure and the growth direction of the synthetic diamond. The growth direction refers to the direction in which the thickness of the layered structure or the synthetic diamond layer increases while the layer or layers are being crystallized, i.e., grown. The order of the growth of gallium nitride, and other wide-gap semiconductors (as defined above) is important in determining the quality of the crystal, the interfaces between layers of different crystalline materials, and ultimately the device performance.

Consequently, the direction of growth is an important attribute of any layered structure comprising wide-gap semiconductors. To illustrate the definition of growth direction, if a gallium nitride layer is grown on a silicon wafer, the growth direction of that gallium nitride layer points in the direction from the silicon wafer towards the gallium nitride layer. If one were to remove the silicon wafer and were left with a freestanding GaN film, the growth direction would remain as an attribute of that freestanding film (pointing in the same direction relative to the film structure).

In case of synthetic diamond, the surface of the diamond layer becomes progressively rougher as the thickness increases. Consequently, the growth direction of synthetic diamond is also a critical attribute of the diamond layer.

In some embodiments, the preferred methods A and B result in devices in which the direction of growth of the layered structure is the same as the direction of growth of the synthetic diamond film. The preferred methods C and D result in devices in which the direction of growth of the layered structure is opposite than the direction of growth of the synthetic diamond. In this way the preferred methods offer design and manufacturing freedom to optimize device performance.

In subsequent descriptions, the word substrate has the function of a heat sink or mechanical support, or both. A substrate means a support structure for a circuit or device and can be made from a combination of materials.

BRIEF DESCRIPTION OF THE DRAWING

FIG. 3 lists the material properties for power transistors;

FIGS. 4A-4J illustrate Method A;

FIGS. 5A-5H illustrate Method B;

FIGS. 6A-6K illustrate Method C;

FIGS. 7A-7L illustrate Method D;

DETAILED DESCRIPTION OF THE INVENTION

METHOD A. The Method A is illustrated with the help of FIGS. 4A through 4J.

Figure 1:
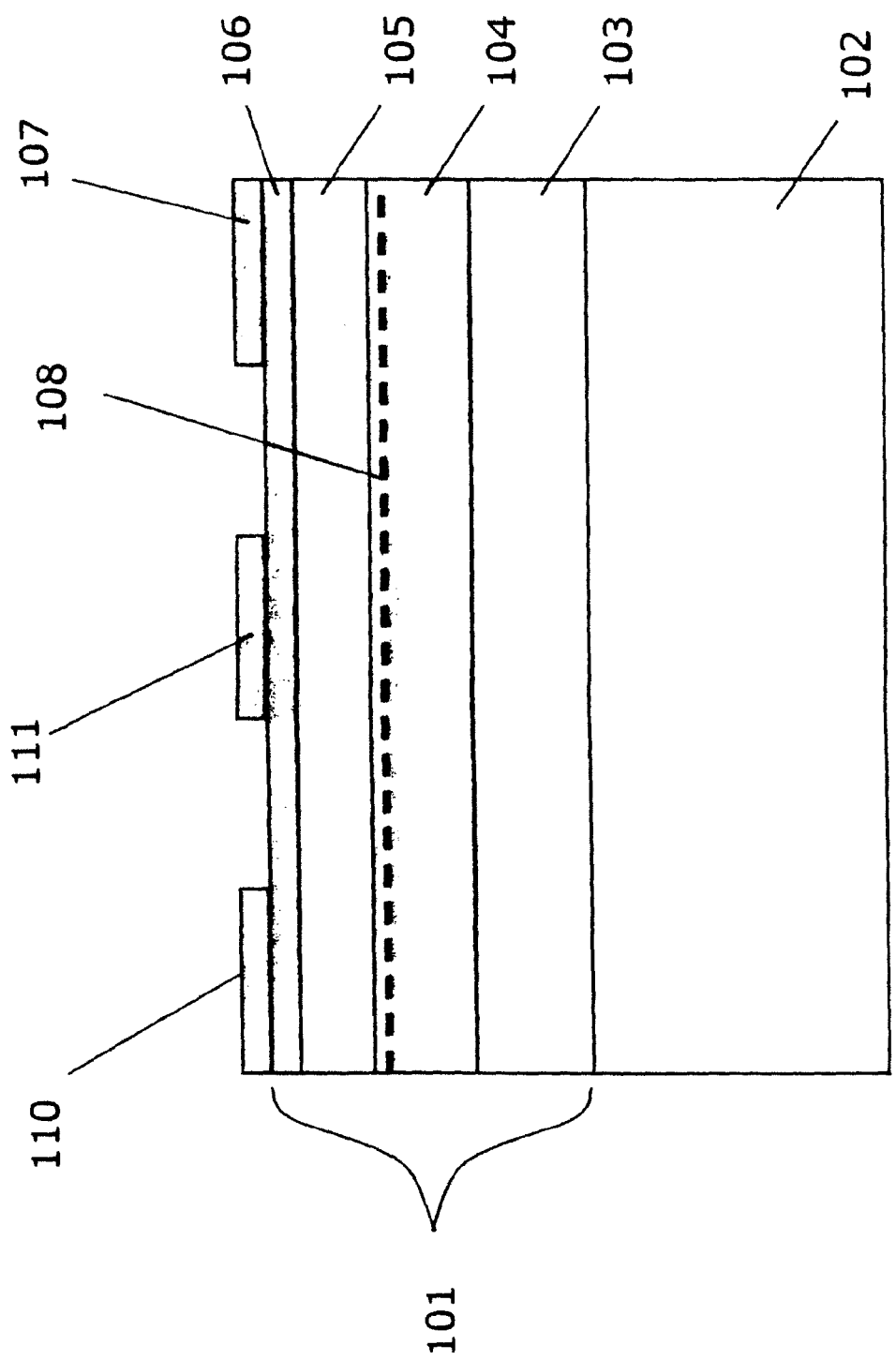
FIG. 1 illustrates Prior Art that shows the layers required in a typical GaN/AlGaN HEMT.
Figure 2:
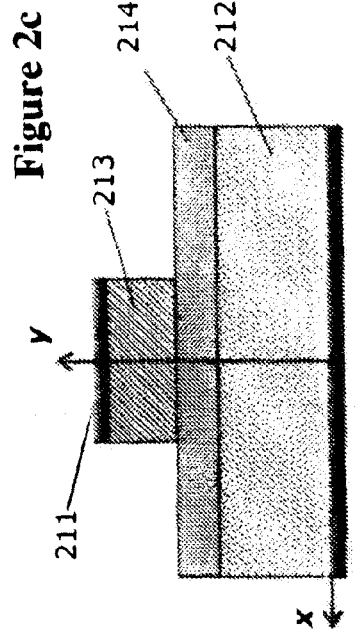
FIGS. 2A-2D illustrate an example of chip cooling improvement by adding heat spreading layers.
Figure 2:
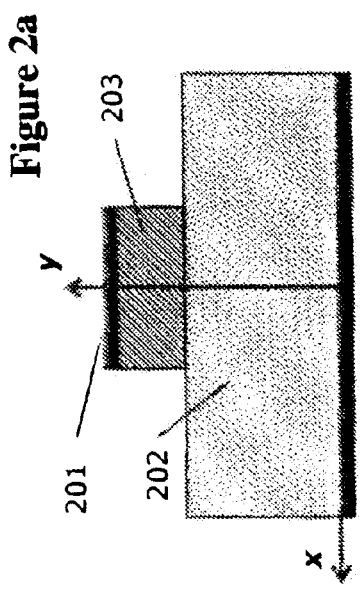
Figure 2:
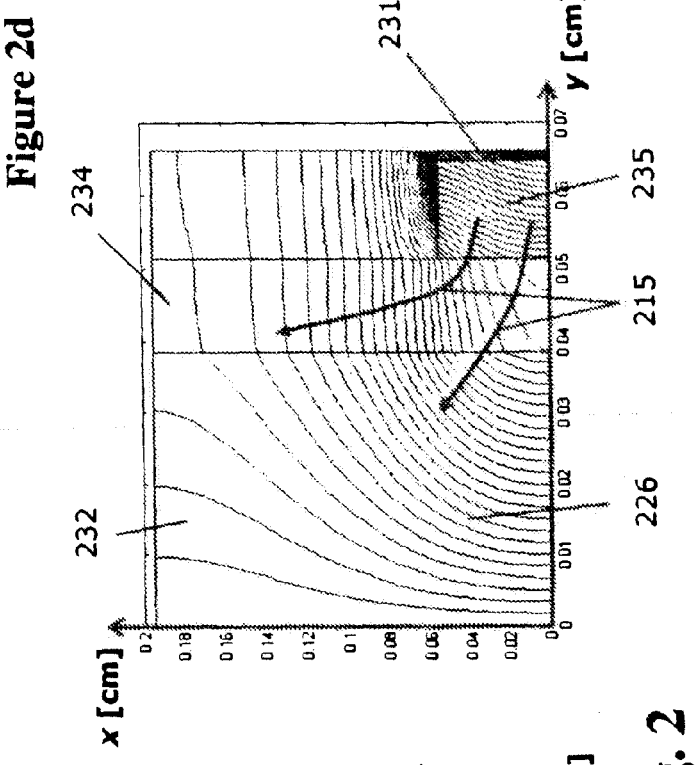
Figure 2:
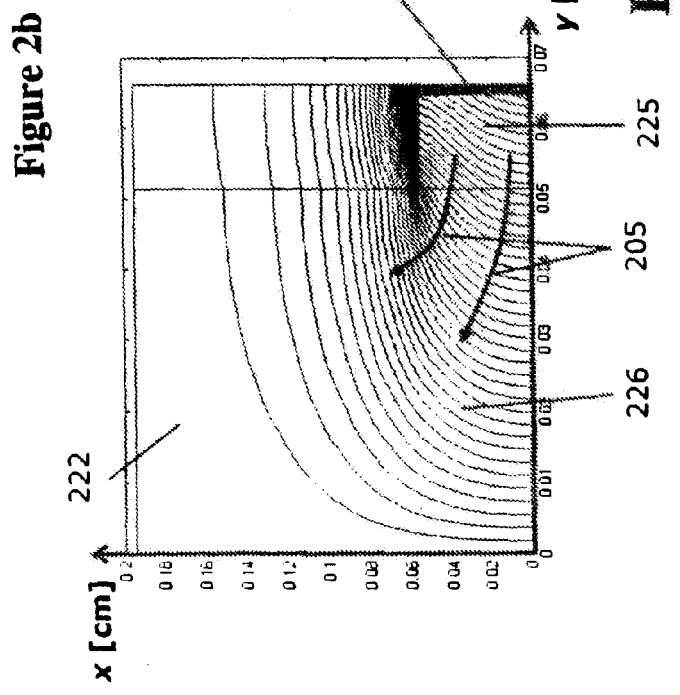

FIG. 4A shows the first two steps of Method A, steps A1 and A2. In step A1, a substrate 400 is provided comprising a silicon wafer 401 and a layered structure 402 on the top surface 403 of the silicon wafer 401. In one embodiment, the layered structure 402 comprises at least one layer made out of gallium nitride, and in another embodiment, the layered structure 402 comprises at least one layer made out of aluminum nitride. In yet another embodiment, the layered structure 402 comprises at least one layer made out of silicon carbide. The layered structure 402 may comprise a part or a complete epilayer structure needed to manufacture a GaN transistor or a GaN-based light-emitting device. An example of what the layered structure 402 may be in a real transistor is shown in FIG. 1 with 101. The layered structure 402 may be grown by MBE or MOCVD, and may comprise a buffer layer as shown in FIG. 1 with 103. The materials that may be used to grow the layered structure are wide-gap semiconductors according to the above definition and the crystal growth techniques used to manufacture the layered structure are epitaxial growth techniques. The growth of the layered structure 402 starts at the top surface 403 of the silicon wafer 401. The surface 408 of the layered structure 402 is adjacent to the top surface 403 of the silicon wafer 401. The growth of the layered structure ends with the top surface 406. The direction of growth is indicated with the arrow 405. All subsequent figures will have the growth direction of the layered structure and the diamond films indicated with a similar arrow.

In the second step A2 of Method A, a nucleation layer 421 is formed on top surface 406 of the layered structure 402. In one embodiment, the nucleation layer 421 is formed by deposition of amorphous silicon carbide, silicon nitride or aluminum nitride. The thickness of the nucleation layer depends on the material used for nucleation. It is determined as the thickness sufficient to nucleate the diamond growth, and is preferably less than 150 nm. Other amorphous or polycrystalline materials as mentioned previously may be used without departing from the scope of present invention. The top surface of the nucleating layer is denoted with 422. In another embodiment, the nucleation layer 421 is formed during the last step of the formation of the layered structure 402. In this latter embodiment, no additional deposition of a nucleating layer is necessary, as the surface 406 of the layered structure 402 has then been prepared for the subsequent step of growing synthetic diamond. In this case, the "nucleation layer surface" 422 means surface 406.

Figure 4B:
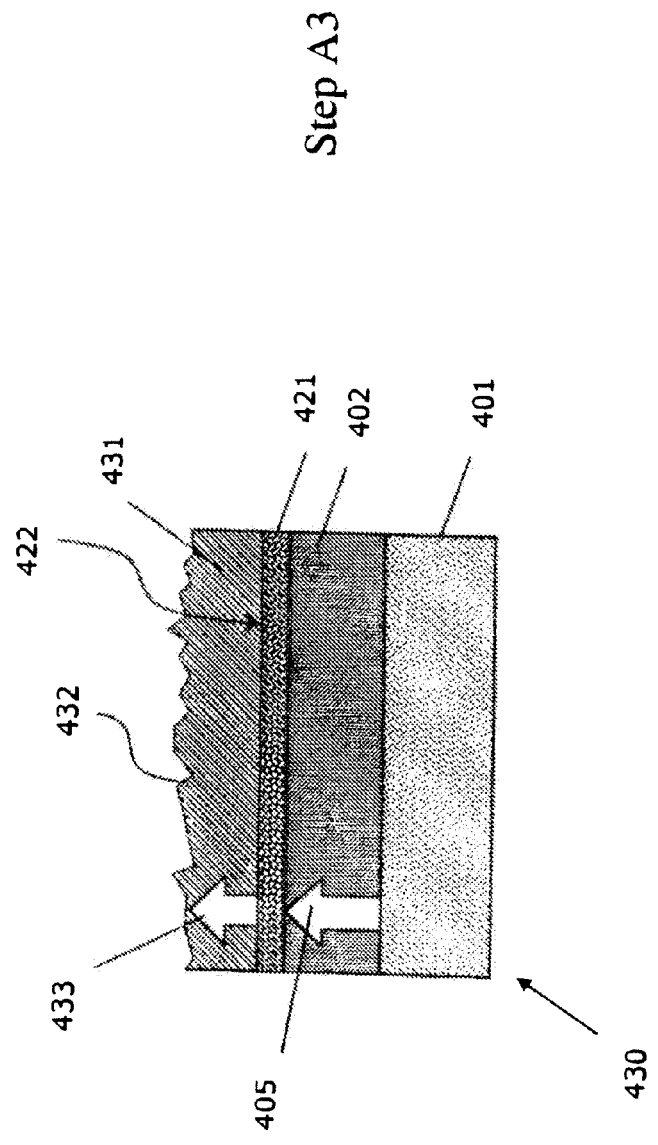
Figure 4C:

FIG. 4B shows the third step of Method A. In step A3, a synthetic diamond layer 431 is grown on the surface 422. The growth direction is indicated with the arrow 433. The growth direction 433 of the diamond layer 431 is the same as the growth direction 405 of the layered structure 402. The thickness of the diamond may vary from approximately several micrometers to hundreds of micrometers depending on the application. During growth, the surface 432 of the synthetic diamond layer 431 becomes rough. The roughness of surface 432 shown in FIG. 4B is exaggerated and not to scale. FIG. 4C shows a scanning-electron micrograph of the cross-section of an exemplary device 430 at step A3, illustrating the embodiment where the layered structure 402 comprises at least one layer made out of gallium nitride. Visible in FIG. 4C are silicon wafer 401, exemplary nucleation layer 421 made out of silicon nitride, wide-gap semiconductor layered structure 402 comprising gallium and aluminum nitride materials, and the synthetic diamond layer 431. The completed structure is denoted with 430.

Figure 4D:
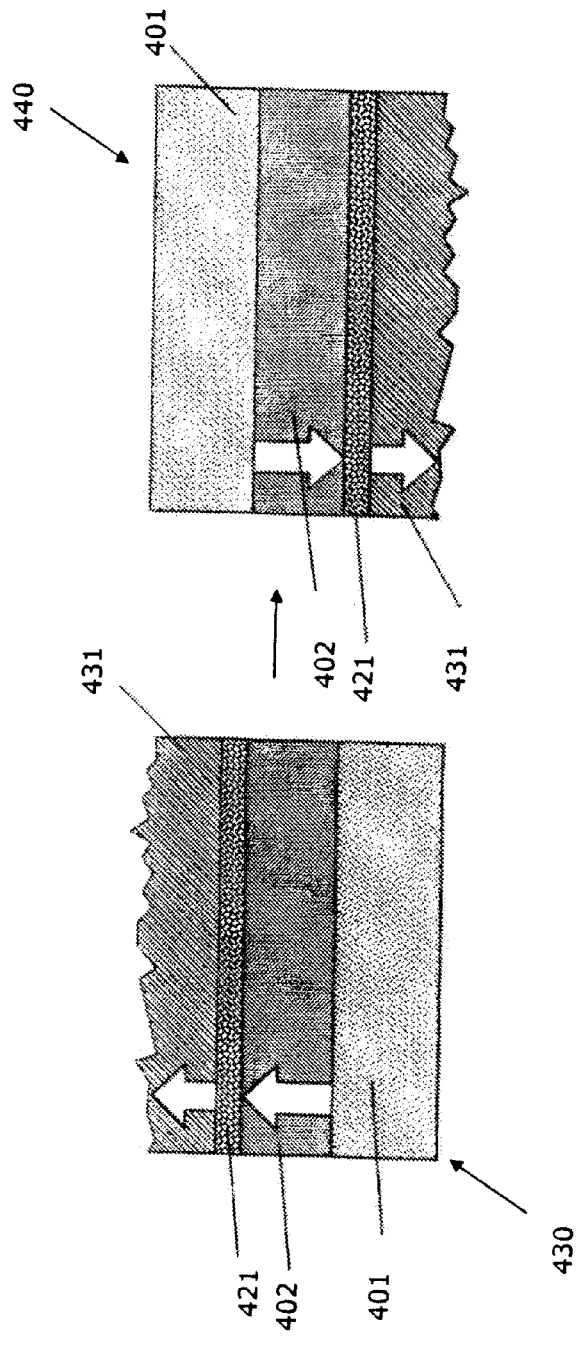
Figure 4E:
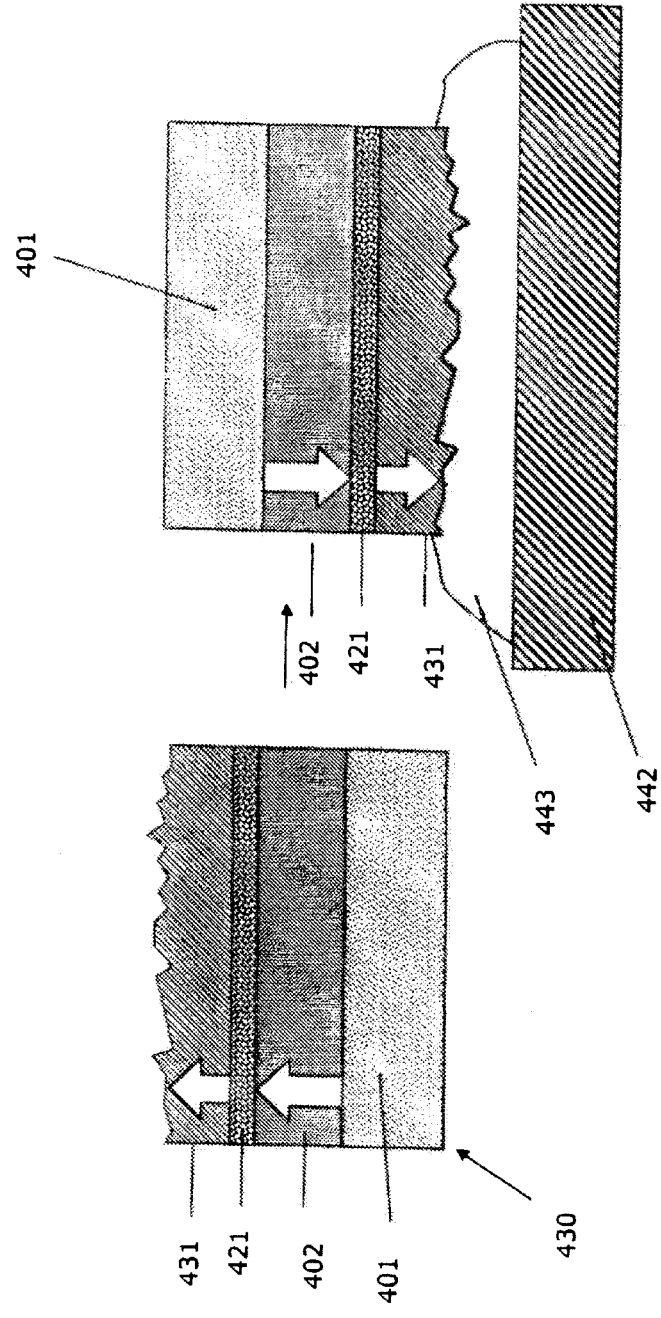
Figure 4F:
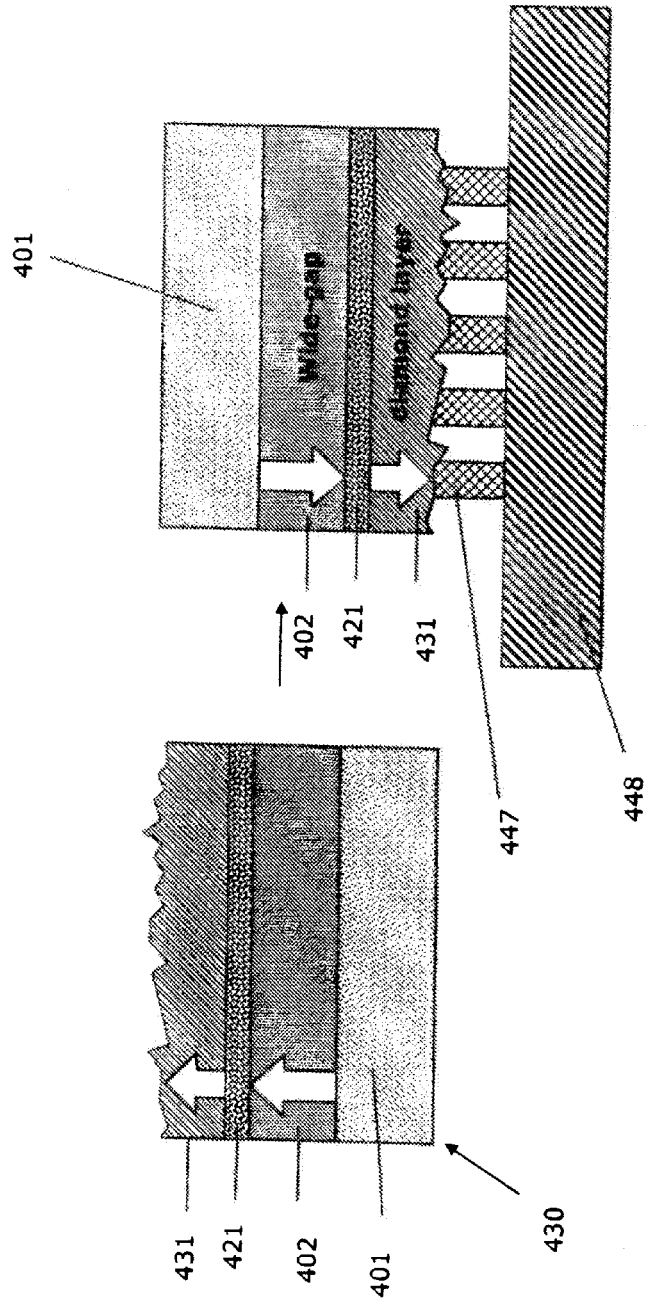

FIGS. 4D-4F show alternatives for the fourth step of Method A. FIG. 4D shows one embodiment of step A4, A4(a). In this embodiment, the completed structure 430 is flipped upside down and further processed as a freestanding structure 440. Freestanding structure means that during the manufacturing of this structure and prior to mounting on the heat sink on which the device will be permanently mounted in the final product, the structure is handled without any additional support.

FIG. 4E shows another embodiment of step A4, A4(b). In this embodiment of the fourth step of Method A, the structure 430 is flipped upside down and at some point in the process mounted at least once onto a temporary substrate 442 using an adhesive or solder 443 before being mounted permanently onto the heat sink on which it will be mounted in the final product.

FIG. 4F shows another embodiment of step A4, A4(c). In this embodiment of the fourth step of Method A, the structure 430 is flipped upside down and at some point in the process mounted at least once onto a temporary substrate 448 using a patterned glass paste 447. Preferred Method E in later text describes how use of patterned glass-paste performs enables simple removal of the structure 430 from the temporary substrate 448. The preferred methods described in this disclosure will not always show that an intermediate (temporary) substrate is used, but it is understood that such substrates may be used from time to time during the manufacturing process. In another embodiment, the completed structure 430 is mounted upside-down onto the heat sink (using solder or an adhesive) on which it will be mounted in the final product.

Figure 4G:
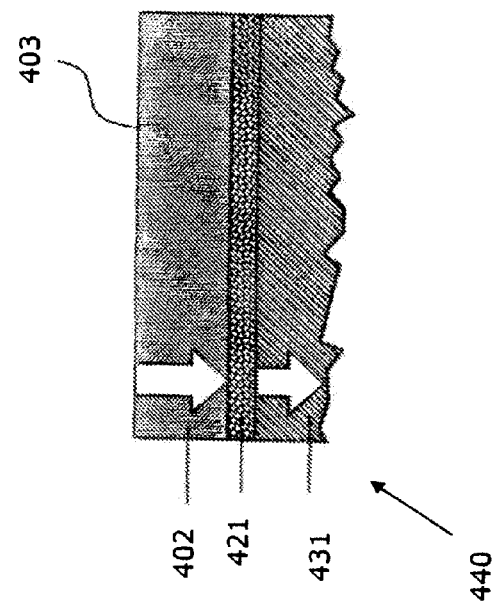
Figure 4H:
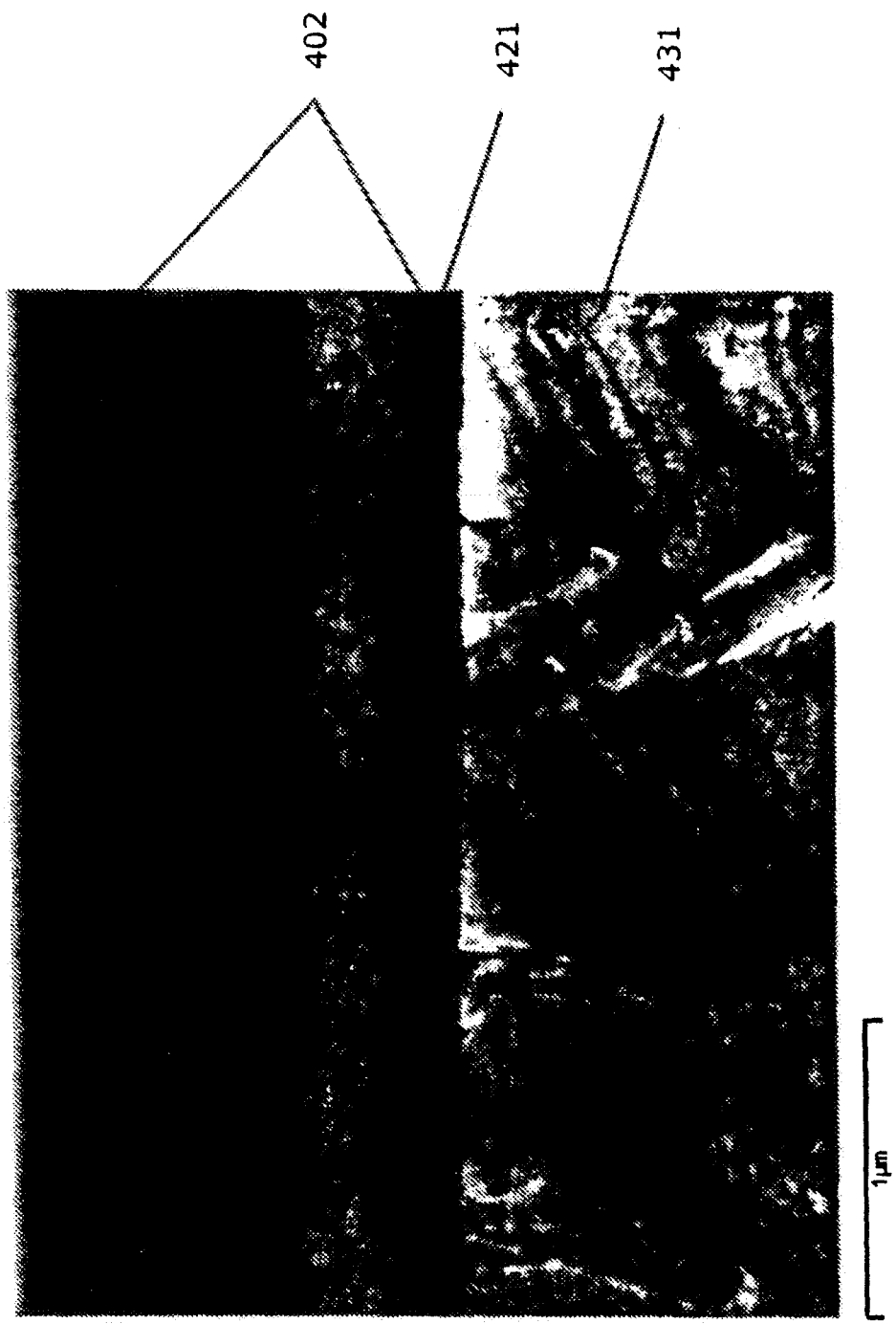

FIG. 4G shows the fifth step of Method A. In the fifth step A5 of Method A, the silicon wafer 401 is removed by chemical etching or mechanical polish or a combination thereof. The surface 403 of the layered structure 402 is now revealed and available for further processing. The structure after step A5 is denoted with 440. FIG. 4H shows a scanning-electron micrograph of the cross-section of an exemplary device 440 at step A5, illustrating the embodiment where the layered structure 402 comprises at least one layer made out of gallium nitride. Visible in FIG. 4H are exemplary nucleation layer 421 made out of silicon nitride, wide-gap semiconductor layered structure 402 comprising gallium and aluminum nitride materials, and the synthetic diamond layer 431. The surface 403 is revealed to allow further processing.

Figure 4I:
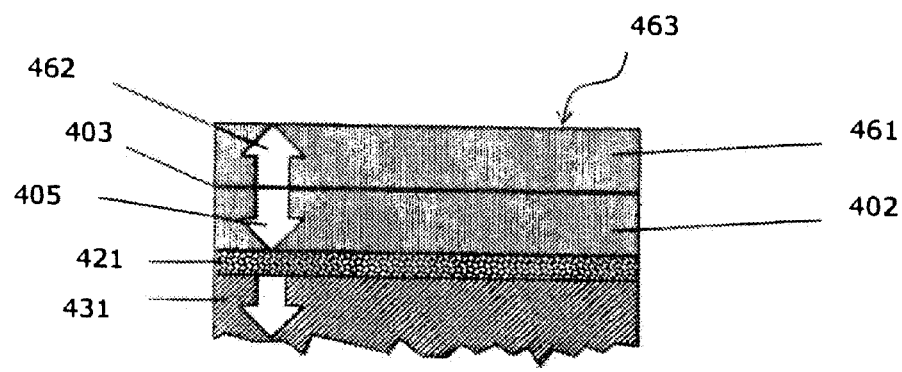

FIG. 4I shows the sixth step of Method A. In one embodiment of Method A (step A6), crystal growth of a wide-gap semiconductor may be performed on the surface 403 of the layered structure 402 in order to form additional layers 461 made out of wide-gap semiconductors. In one embodiment, prior to growing additional layers 461, the surface 403 is etched to reveal higher quality material. In these two embodiments, the layered structure 402 has served as a "seed" layer for continued growth of wide-gap semiconductors. In this case, the growth direction 462 of wide-gap semiconductor layers 461 is opposite from the growth direction 405.

Figure 4J:
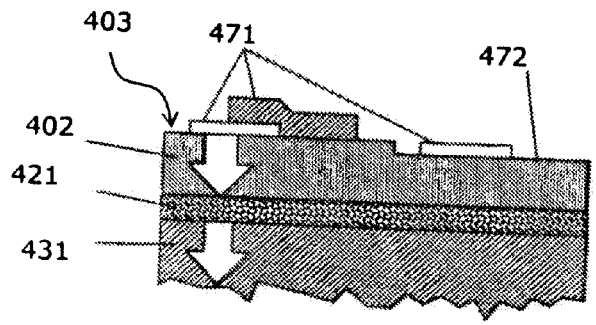

FIG. 4J shows the seventh step of Method A. In yet another embodiment of Method A (step A7), the surface 403 of the layered structure 402 is further processed toward making electronic or optoelectronic devices. This processing may include removing some or part of layers (shown for example with 472) of the layered structure 402, depositing metals or dielectrics onto the resulting surface (shown with 471), or any other process used in the manufacture of wide-gap semiconductors. Both steps A6 and A7 may occur in a process. In that case, surface 463 may be the surface being processed in step A7 rather than surface 403.

METHOD B. As an alternative to Method A, Method B is illustrated with the help of FIGS. 5A through 5H.

Figure 5A:
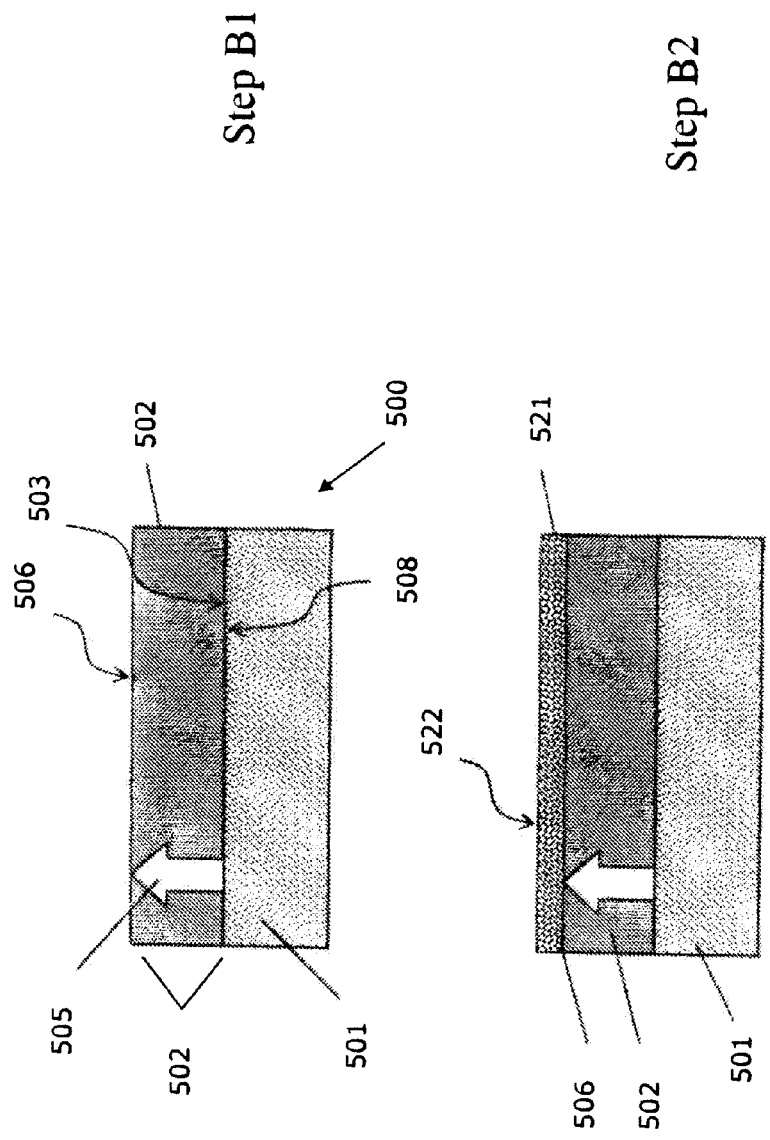

FIG. 5A shows the first and second steps of Method B, steps B1 and B2. In the first step B1 of Method B, a substrate 500 is provided comprising a silicon wafer 501 and a layered structure 502 on the top surface 503 of the silicon wafer 501. In one embodiment, the layered structure 502 comprises at least one layer made out of gallium nitride, and in another embodiment, the layered structure 502 comprises at least one layer made out of aluminum nitride. In yet another embodiment, the layered structure 502 comprises at least one layer made out of silicon carbide. The layered structure 502 may comprise a part or a complete epilayer structure needed to manufacture a GaN transistor or a GaN-based light-emitting device. An example of what the layered structure 502 would be in a real device is shown in FIG. 1 with 101. The layered structure 502 may be grown by MBE or MOCVD, and may comprise a buffer layer as shown in FIG. 1 with 103. The materials that may be used to grow the layered structure are wide-gap semiconductors. The growth of the layered structure 502 starts at the top surface 503 of the silicon wafer 501. The surface 508 of the layered structure 502 is adjacent to the top surface 503 of the silicon wafer 501. The growth of the layered structure ends with the top surface 506. The direction of growth is indicated with the arrow 505.

In step B2, the second step of Method B, a nucleation layer 521 is formed on top surface 506 of the layered structure 502. In one embodiment, the nucleation layer 521 is formed by deposition of amorphous silicon nitride, silicon carbide or aluminum nitride. The thickness of the nucleation layer depends on the material used for nucleation. It is determined as the thickness sufficient to nucleate the diamond growth, and is preferably less than 150 nm. Other amorphous or polycrystalline materials mentioned previously may be used without departing from the scope of present invention. The surface of the nucleating layer is denoted with 522. In another embodiment, the nucleation layer 521 is formed during the last step of the formation of the layered structure 502. In this latter embodiment, no deposition of a nucleating layer (as described in B2) is necessary, as the surface 506 of the layered structure 502 has then been prepared for the subsequent step of growing synthetic diamond. In this case, the "nucleation layer surface" 522 means surface 506.

Figure 5B:
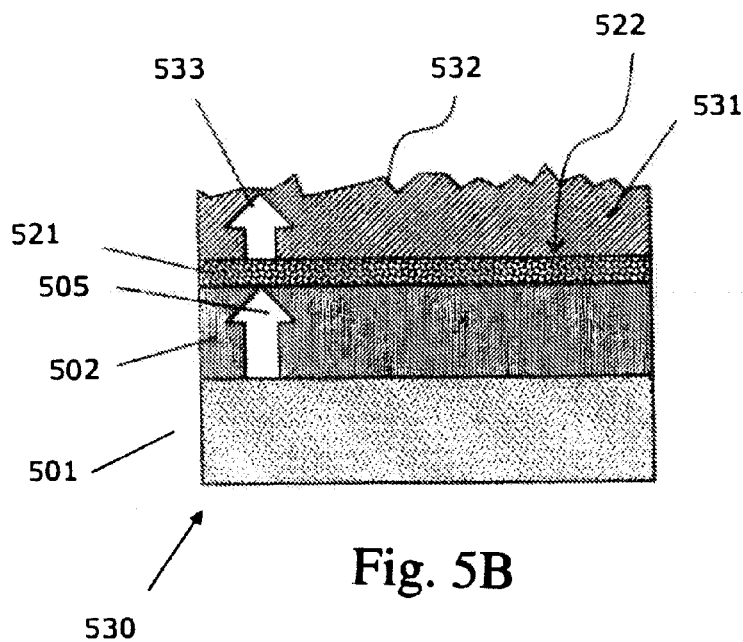

FIG. 5B shows the third step B3 of Method B. In B3, a synthetic diamond layer 531 is grown on the surface 522. The growth direction is indicated with the arrow 533. The growth direction 533 of the diamond layer 531 is the same as the growth direction 505 of the layered structure 502. The thickness of the diamond may vary from several micrometers to hundreds of micrometers depending on the application. During growth, the surface 532 of the synthetic diamond becomes rough. The completed structure is denoted with 530.

Figure 5F:
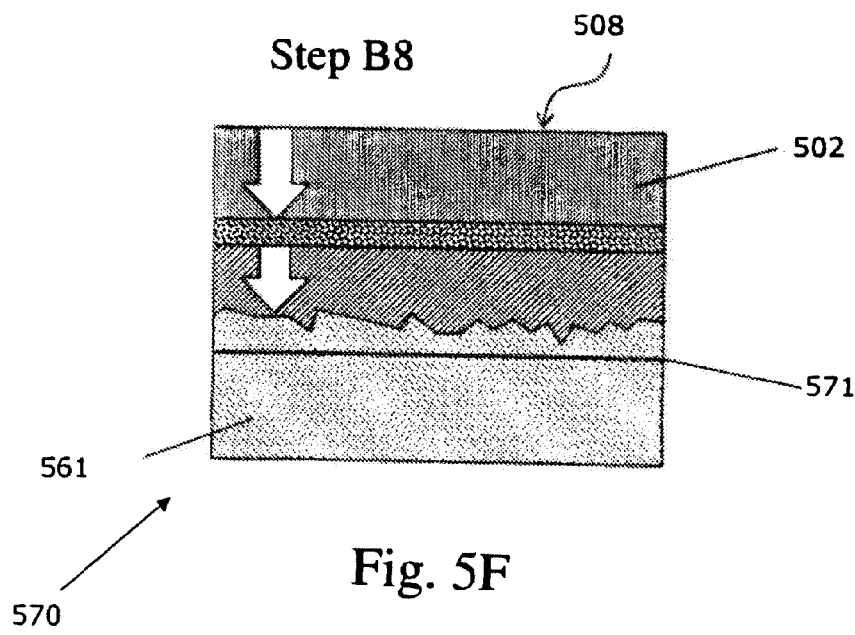
Figure 5C:
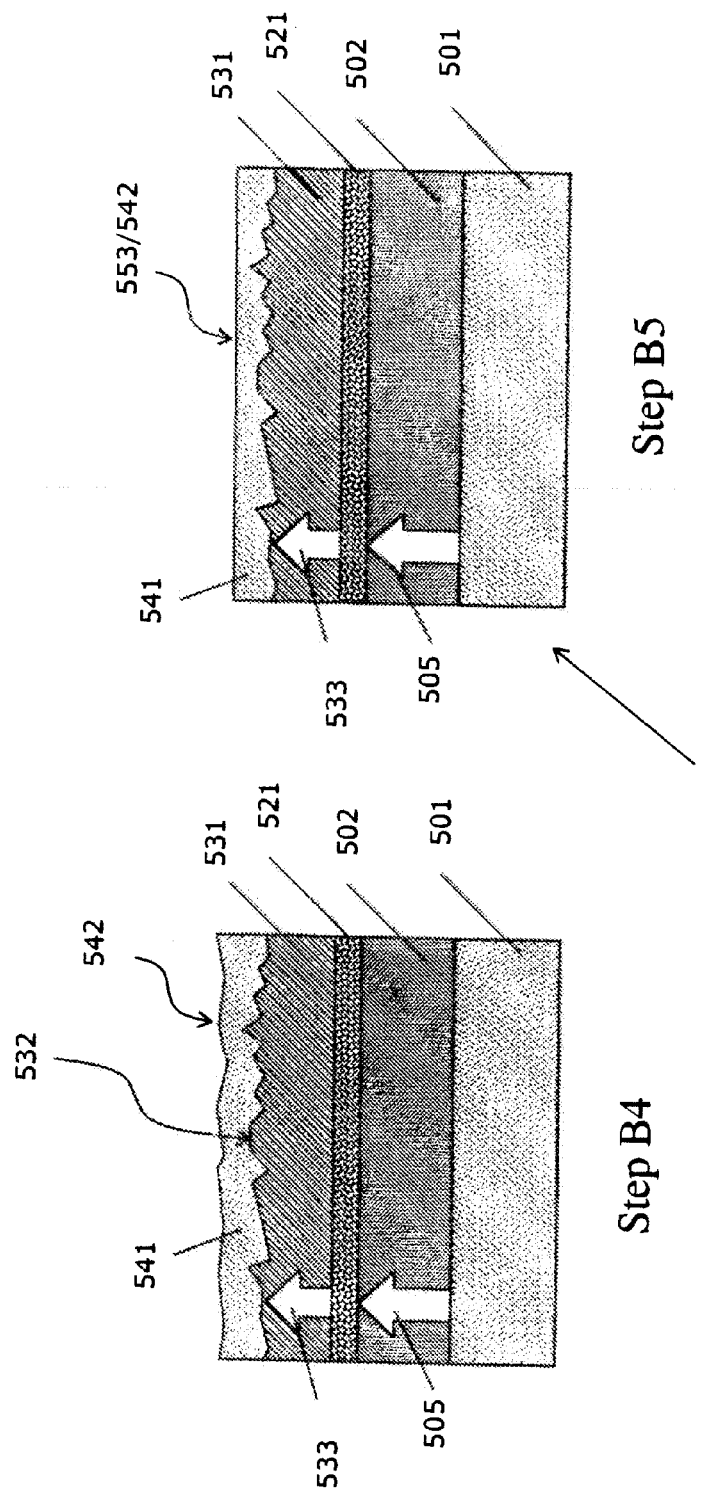

FIG. 5C shows the fourth and fifth steps of Method B, steps B4 and B5. In the fourth step B4 of Method B, a layer of polysilicon 541 is grown on top of the surface 532 of synthetic diamond 531. The thickness of the polysilicon layer is greater than the diamond surface bow measured on a rectangle with area of approximately 100 square micrometers. The surface 542 of the deposited polysilicon layer 541 is also rough owing to the roughness of the underlying rough surface 532 of the diamond layer 531.

In the fifth step B5 of Method B, the surface 542 of the polysilicon layer 541 is polished forming a structure 550. The surface 542 is polished and then renamed to 553. The rms roughness of polished polysilicon surface 553 is typically less than 2 nm measured of a square with sides equal to approximately 100 micrometers. At the end of step B5, the bow of a 4" wafer is preferably less than approximately 100 micrometer (or a scaled value, if smaller wafers are used).

FIG. 5D shows the sixth step B6 of Method B. In the sixth step B6 of Method B, a second substrate 561 is provided. The second substrate 561 is preferably a silicon substrate, but other semiconductor materials as mentioned previously or any of those substrates with other materials deposited on their top can be used. The top surface of second substrate 561 is denoted with 562. The typical requirements on the surface 562 and the second substrate 561 are that (a) the rms surface roughness (of surface 562) be less than approximately 2 nm measured over an approximately 100-micrometer square, (b) the substrate 561 bow is less than approximately 100 micrometers on an approximately 4-inch wafer, and (c) that the surface material present on the surface 562 can be efficiently bonded to the polysilicon surface 553. The structure 550 is flipped upside down onto the second substrate 561 in such a way that the polished polysilicon surface 553 becomes adjacent to the surface 562 of second substrate 561. This flip is illustrated with the arrow 569.

Figure 5E:
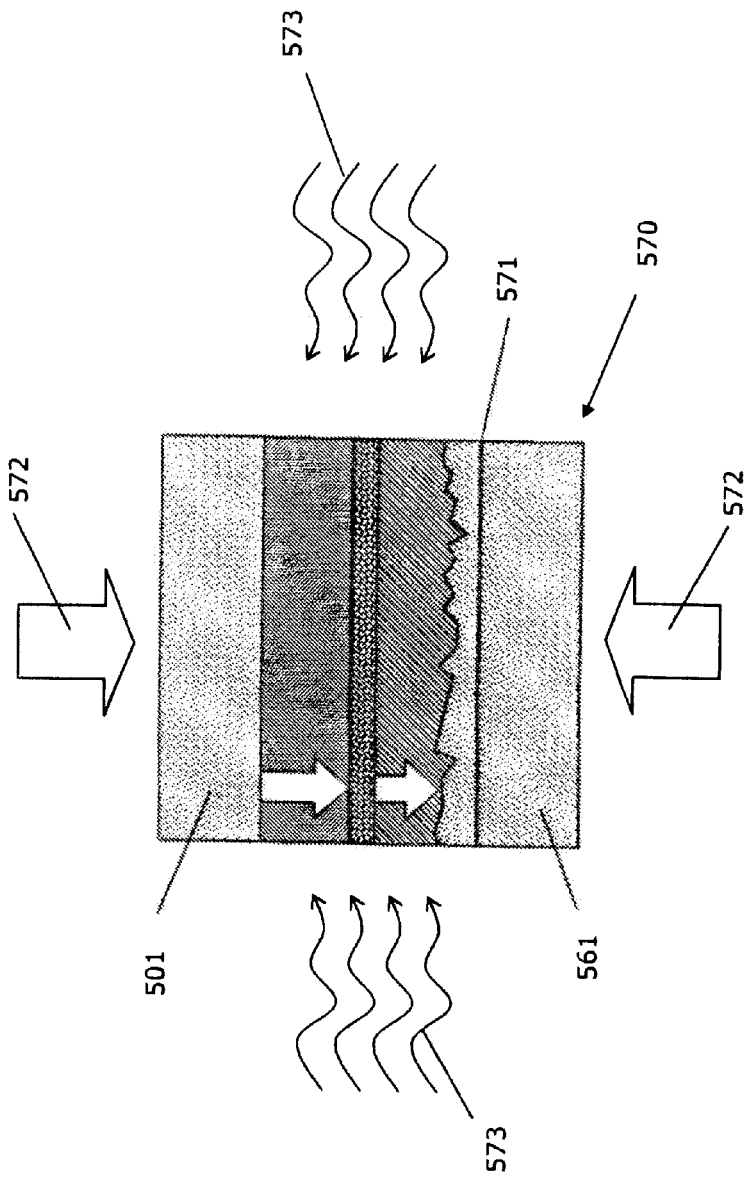

FIG. 5E shows the seventh step B7 of Method B. In the seventh step B7 of Method B, the structure 550 is bonded to the substrate 561 under axial pressure denoted with the arrows 572 and heat illustrated with arrows 573. The pressure varies from approximately zero to approximately 1 MPa, while the typical temperature for bonding silicon to silicon is around 350° C. The resulting bonded structure is denoted with 570.

FIG. 5F shows the eighth step B8 of Method B. In the eighth step B8 of Method B, the silicon wafer 501 is removed by chemical etching or mechanical polish or a combination thereof from the bonded structure 570. The surface 508 of the layered structure 502 is now revealed and available for further processing. The bonded interface is denoted with 571.

Figure 5G:
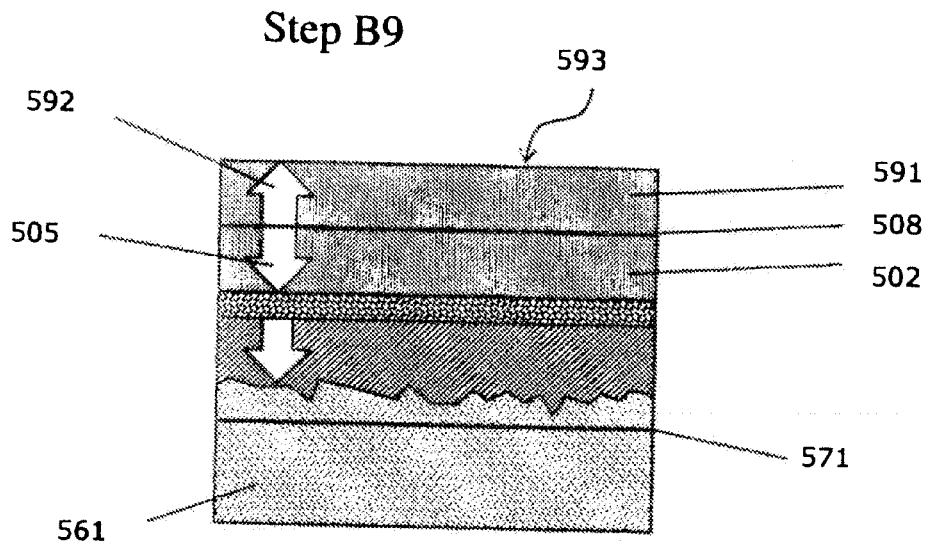

FIG. 5G shows the ninth step B9 of Method B. In one embodiment of Method B (step B9), crystal growth of wide-gap semiconductors may be performed on the surface 508 of the layered structure 502 in order to form additional layers 591. In one embodiment, prior to growing additional layers 591, the surface 508 is etched to reveal higher quality material. In these two embodiments, the layered structure 502 serves as a "seed" layer for continued growth of wide-gap semiconductors. The growth direction 505 of the layered structure 502 is opposite from the growth direction 592 of the newly grown wide-gap semiconductor layers 591.

Figure 5H:
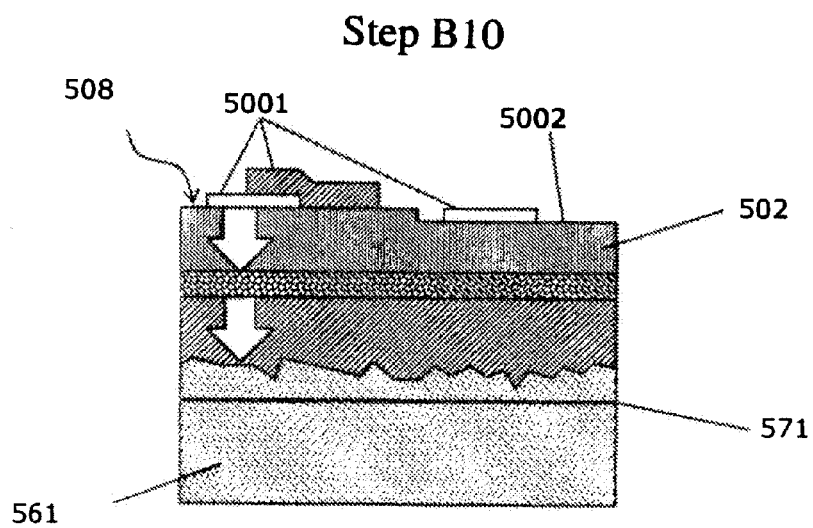

FIG. 5H shows the tenth step B10 of Method B. In yet another embodiment of Method B (step B10), the surface 508 of the layered structure is further processed toward making electronic or optoelectronic devices. This processing may include removing some or part of layers (illustratively shown with 5002) of the layered structure 502, depositing metals or dielectrics onto the resulting surface (illustratively shown with 5001), or any other process known to be used for the manufacture of wide-gap semiconductors. Both steps B9 and B10 may occur in a process. In that case, surface 593 may be the surface being processed in step B10 rather than surface 508.

METHOD C. Method C is illustrated with the help of FIGS. 6A through 6K.

Figure 6A:
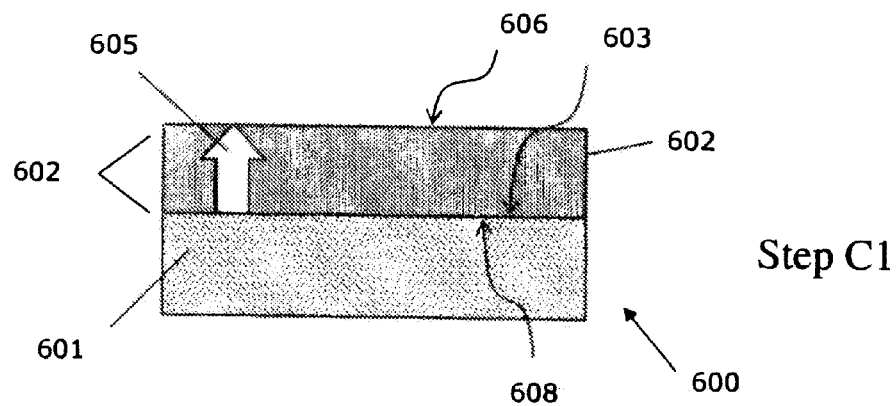

FIG. 6A shows the first step C1 of Method C. In the first step C1 of Method C, a substrate 600 is provided comprising a silicon wafer 601 and a layered structure 602 on the top surface 603 of the silicon wafer 601. In one embodiment, the layered structure 602 comprises at least one layer made out of gallium nitride, and in another embodiment, the layered structure 602 comprises at least one layer made out of aluminum nitride. In yet another embodiment, the layered structure 602 comprises at least one layer made out of silicon carbide. The layered structure 602 may comprise a part or a complete epilayer structure needed to manufacture a GaN transistor or a GaN-based light-emitting device. An example of what the layered structure 602 would be in a real device is shown in FIG. 1 with 101. The layered structure 602 may be grown by MBE or MOCVD, and may comprise a buffer layer as shown in FIG. 1 with 103. The materials that may be used to grow the layered structure are wide-gap semiconductors. The growth of the layered structure 602 starts at the top surface 603 of the silicon wafer 601. The surface 608 of the layered structure 602 is adjacent to the top surface 603 of the silicon wafer 601. The growth of the layered structure ends with the top surface 606. The direction of growth is indicated with the arrow 605.

Figure 6D:
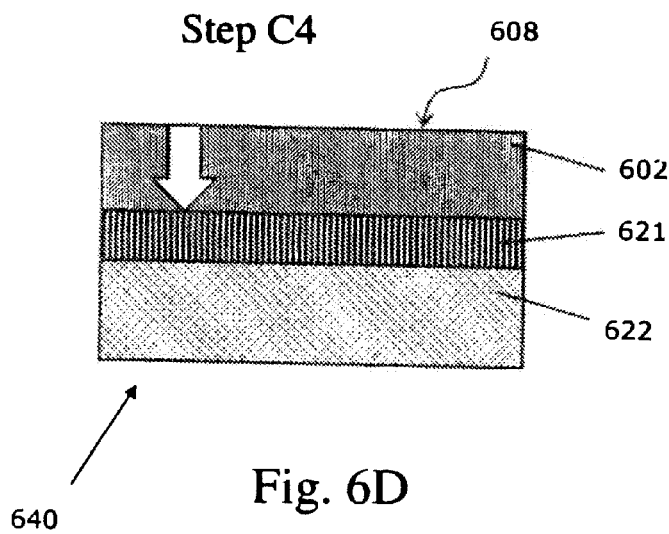
Figure 6B:
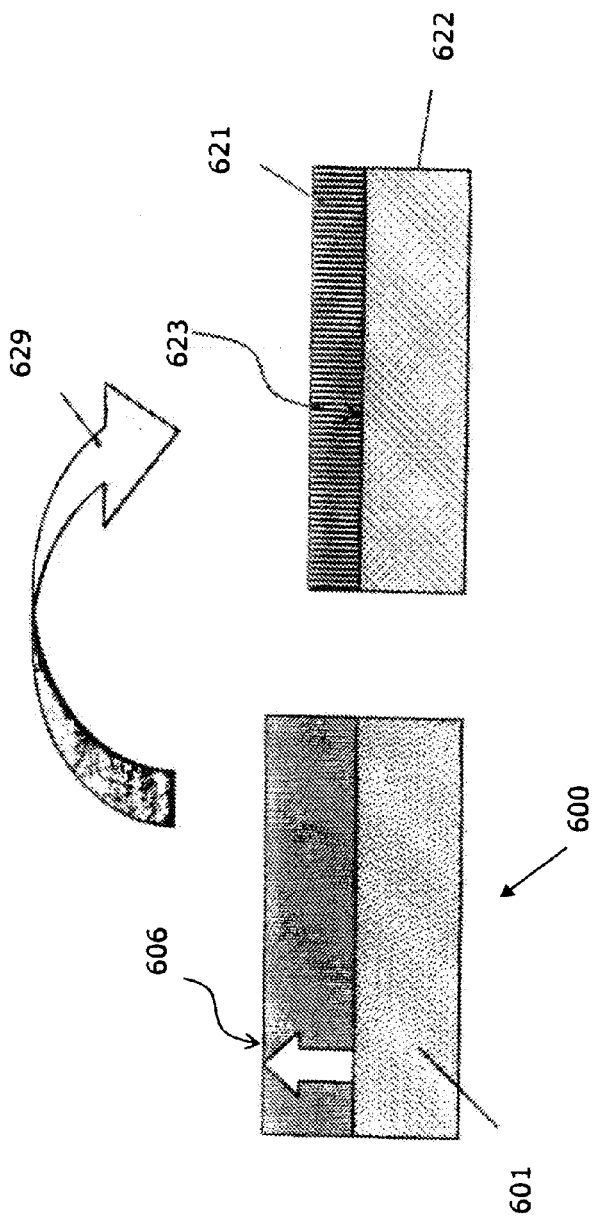

FIG. 6B shows the second step C2 of Method C. In the second step C2 of Method C, a second substrate 622 is provided. The second substrate 622 has surface 623. The second substrate 622 is preferably a silicon substrate, but other semiconductor materials or a silicon substrate with other materials deposited onto the top surface 623 can be used. An adhesion layer 621 is deposited on either the surface 606, or the surface 623 of the second substrate 622, or on both. Figure C2 shows the example in which the adhesion layer 621 is deposited onto surface 623 of the second substrate 622. It is clear that any one of these three combinations may be employed without departing from the scope of the invention. The typical requirement on the adhesion layer is that it can withstand the temperatures required for later growth of synthetic diamond (around 800° C.). The structure 600 is flipped upside down onto the second substrate 622 as indicated with arrow 629 in such a way that surface the surface 606 faces the surface 623 of the second substrate 622. The resulting structure is denoted 630 in FIG. 6C.

FIG. 6C shows the third step C3 of Method C. In the third step C3 of the Method C, the structure 630 is bonded by applying axial pressure (illustrated with arrows 632) and heat (illustrated with arrows 633). The pressure may vary from zero to 1 MPa, while typical temperatures for bonding may be around 350° C.

FIG. 6D shows the fourth step C4 of Method C. In the fourth step C4 of Method C, the silicon wafer 601 removed by chemical etching or mechanical polish or a combination thereof from the bonded structure 630 of 6C. The surface 608 of the layered structure 602 is now revealed. The resulting structure is denoted with 640.

Figure 6E:
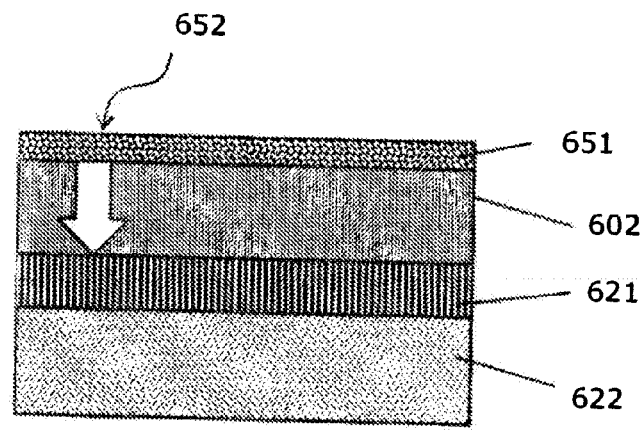

FIG. 6E shows the fifth step C5 of Method C. In the fifth step C5 of Method C, a nucleation layer 651 is formed on top surface 608 of the layered structure 602. In one embodiment, the nucleation layer 651 is formed by deposition of amorphous silicon nitride, silicon carbide, or aluminum nitride. The thickness of the nucleation layer depends on the material used for nucleation. It is determined as the thickness sufficient to nucleation the diamond growth, and is preferably less than approximately 150 nm. Other amorphous or polycrystalline materials mentioned previously may be used without the departing from the scope of the invention. The surface of the nucleating layer is denoted with 652. In another embodiment, the nucleation layer 651 is formed during the last step of the formation of the layered structure 652. In this latter embodiment, no additional deposition of a nucleating layer is necessary, as the surface 608 of the layered structure 652 has then been prepared for the subsequent step of growing synthetic diamond. In this case, the "nucleation layer surface" 652 means surface 608.

Figure 6F:
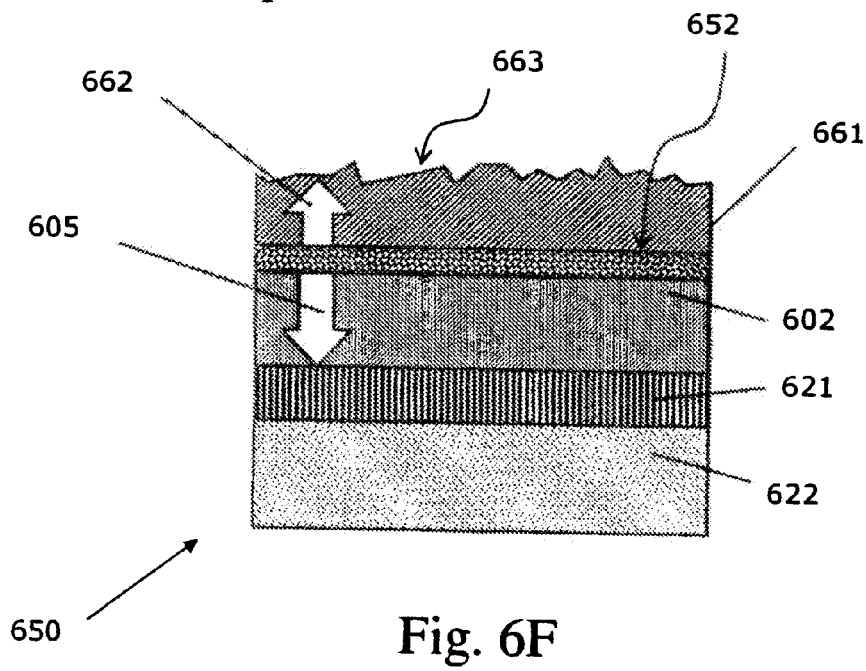

FIG. 6F shows the sixth step C6 of Method C. In the sixth step C6 of Method C, a synthetic diamond layer 661 is grown on the surface 652. The growth direction is indicated with the arrow 662. The growth direction 662 of the diamond layer 661 is the opposite from the growth direction 605 of the layered structure 602. The thickness of the diamond may vary typically from several micrometers to hundreds of micrometers depending on the application. During growth, the surface 663 of the synthetic diamond becomes rough. The completed structure is denoted with 650.

Figure 6G:
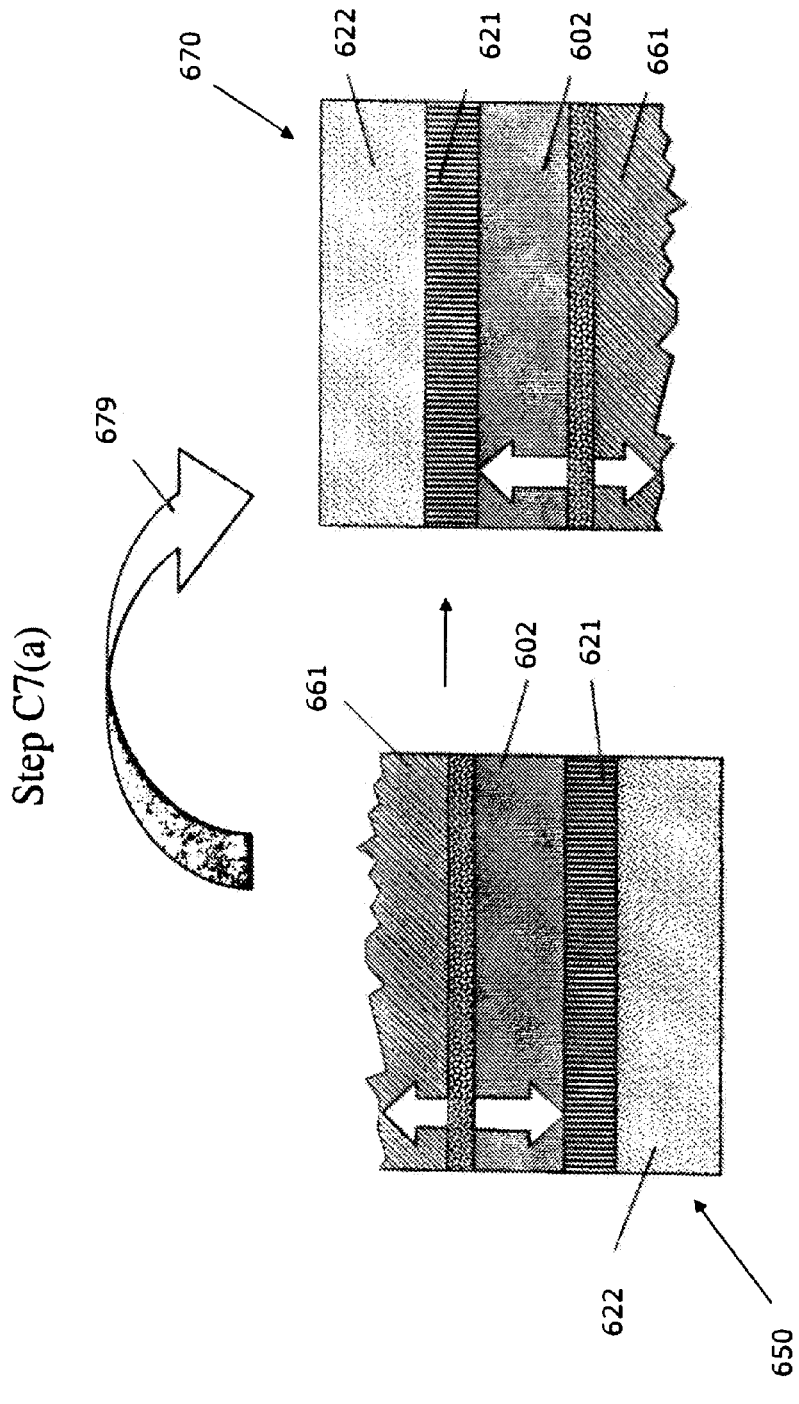
Figure 6H:
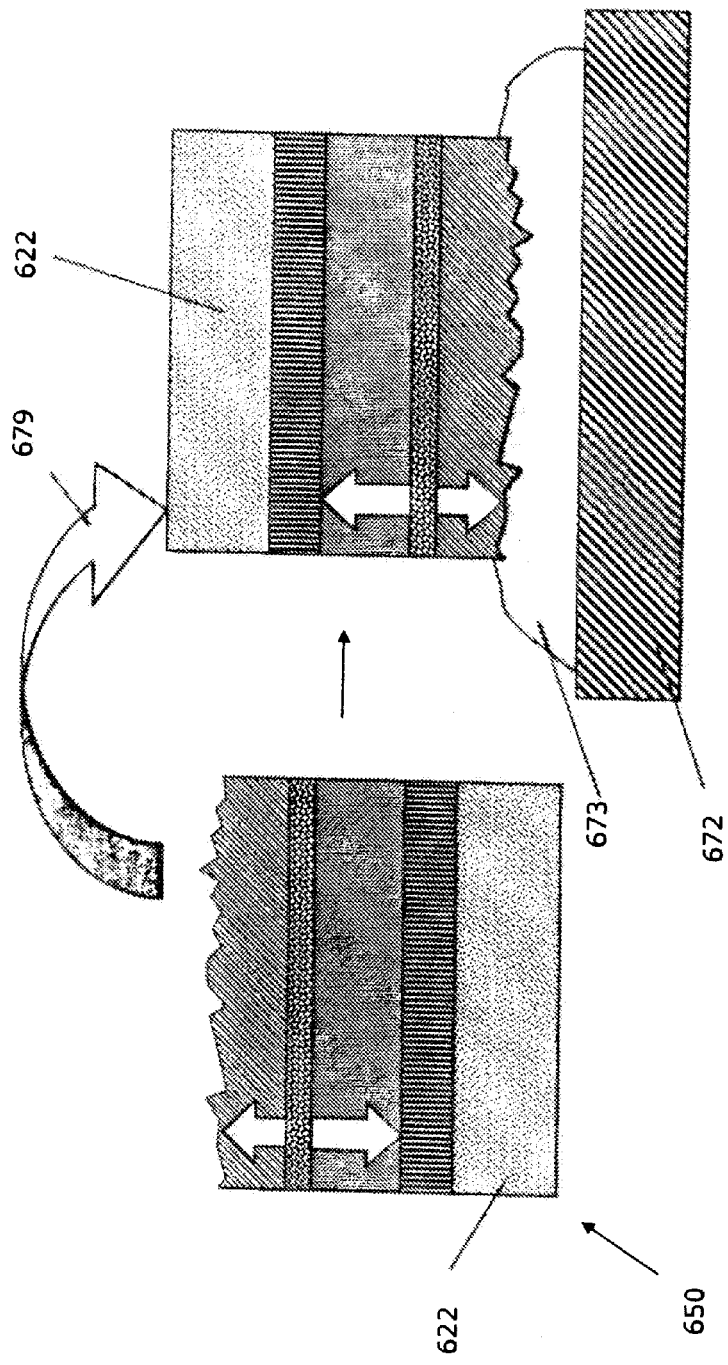

FIGS. 6G and 6H show alternatives for the seventh step of Method C. FIG. 6G shows one embodiment, C7(a), of the seventh step C7 of Method C. In C7(a) the completed structure 650 is flipped upside down as illustrated with arrow 679 and further processed as a freestanding substrate. Freestanding structure means that during the manufacturing of this structure and prior to mounting on the heat sink on which the device will be permanently mounted in the final product, the structure is handled without any additional support.

FIG. 6H shows another embodiment, C7(b), of the seventh step C7 of Method C. In this embodiment, the structure 650 is flipped upside down and at some point in the process mounted at least once onto a temporary substrate 672 using an adhesive or solder 673 before being mounted permanently onto the heat sink on which it will be mounted in the final product. The methods described in this disclosure do not show an intermediate (temporary) substrate used, but it is understood that such substrates may be used from time to time, and that Method E may be used for transferring or supporting the structure 650 during processing. In another embodiment, the completed structure 650 is mounted upside-down onto the heat sink on which it will be mounted in the final product (this is not shown in this figure).

Figure 6I:
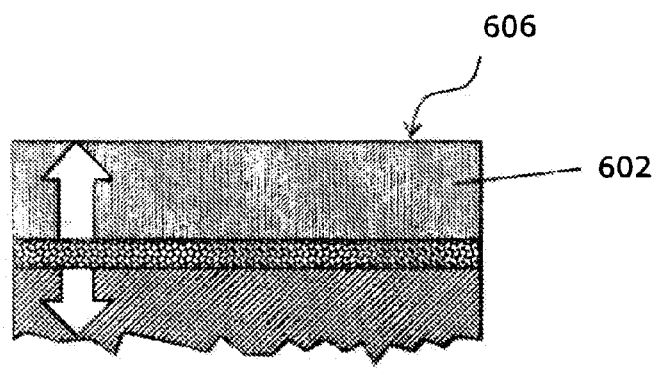

FIG. 6I shows the eighth step C8 of Method C. In the eighth step C8 of Method C, the silicon substrate 622 and the adhesion layer 621 is removed by chemical etching or mechanical polish or a combination thereof. The surface 606 of the layered structure 602 is now revealed and available for further processing.

Figure 6J:
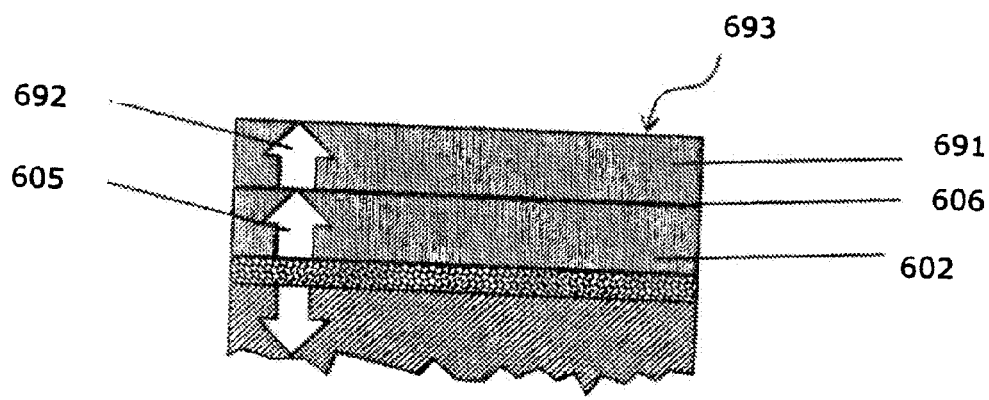

FIG. 6J shows the ninth step C9 of Method C. In one embodiment of Method C (step C9), crystal growth of wide-gap semiconductors may be performed on the surface 606 of the layered structure 602 in order to form additional layers 691. In this embodiment, the layered structure 602 has served as a "seed" layer for continued growth of wide-gap semiconductors. The growth direction 692 of the wide-gap semiconductor layers 691 is the same as the growth direction 605 of the layered structure 602.

Figure 6K:
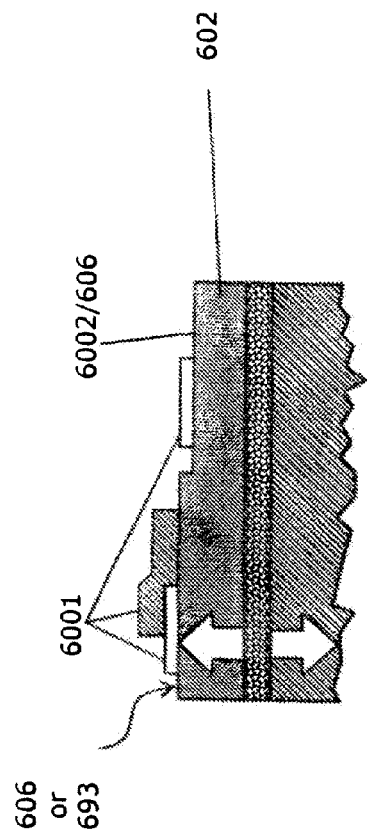

FIG. 6K shows the tenth step C10 of Method C. In yet another embodiment of Method C (step C10), the surface 606 of the layered structure 602 is further processed toward making electronic or optoelectronic devices. This processing may include removing some or part of layers (shown with 6002) of the layered structure 602, depositing metals or dielectrics onto the resulting surface (shown with 6001), or any other process known for the manufacture of wide-gap semiconductors. Both steps C9 and C10 may occur in a process. In that case, surface 693 may be the surface being processed in step C10 rather than surface 606.

METHOD D. Method D is illustrated with the help of FIGS. 7A through 7L.

Figure 7A:
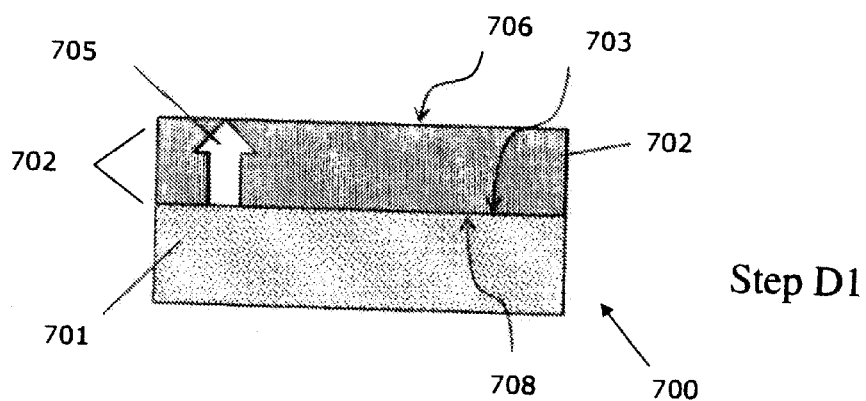

FIG. 7A shows the first step D1 of Method D. In the first step D1 of Method D, a substrate 700 is provided comprising a silicon wafer 701 and a layered structure 702 on the top surface 703 of the silicon wafer 701. In one embodiment, the layered structure 702 comprises at least one layer made out of gallium nitride, and in another embodiment, the layered structure 702 comprises at least one layer made out of aluminum nitride. In yet another embodiment, the layered structure 702 comprises at least one layer made out of silicon carbide. The layered structure 702 may comprise a part or a complete epilayer structure needed to manufacture a GaN transistor or a GaN-based light-emitting device. An example of what the layered structure 702 would be in a real device is shown in FIG. 1 with 101. The layered structure 702 may be grown by MBE or MOCVD, and may comprise a buffer layer as shown in FIG. 1 with 103. The materials that may be used to grow the layered structure are wide-gap semiconductors. The growth of the layered structure 702 starts at the top surface 703 of the silicon wafer 701. The surface 708 of the layered structure 702 is adjacent to the top surface 703 of the silicon wafer 701. The growth of the layered structure ends with the top surface 706. The direction of growth is indicated with the arrow 705.

Figure 7D:
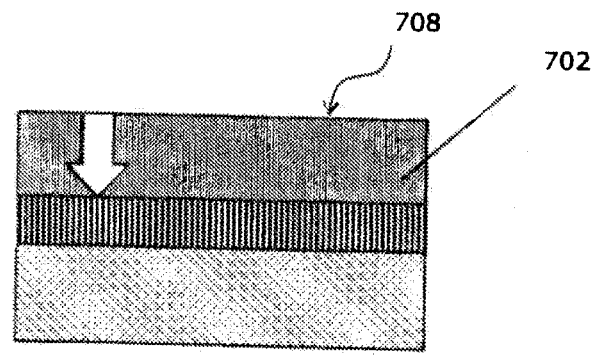
Figure 7B:
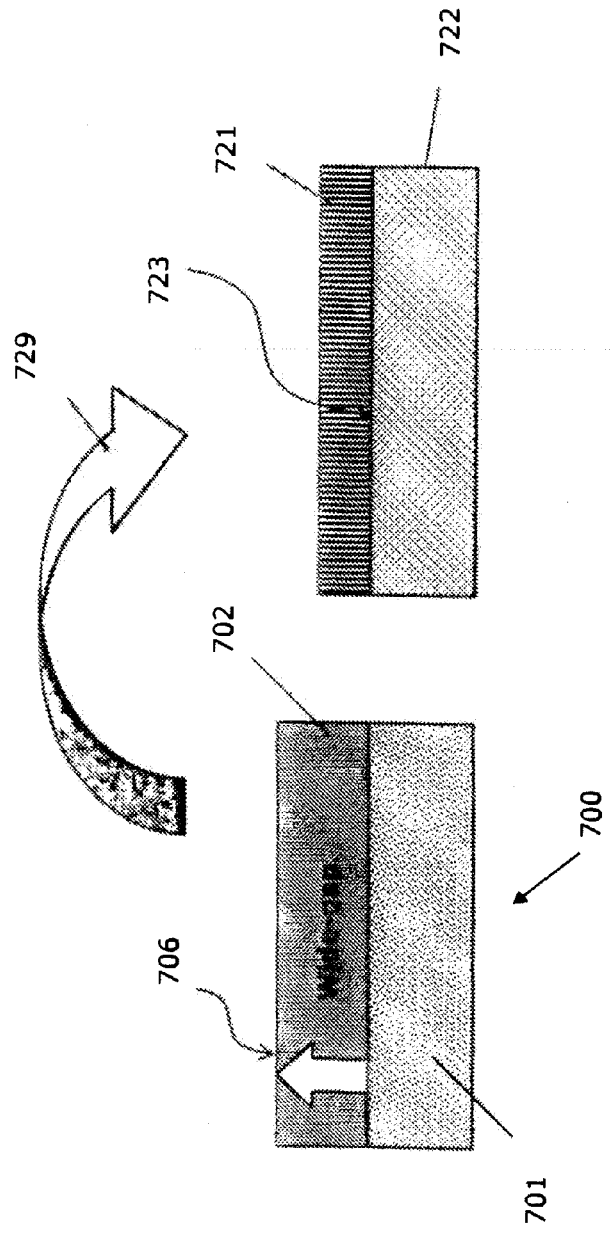

FIG. 7B shows the second step D2 of Method D. In the second step D2 of Method D, a second substrate 722 is provided. The second substrate 722 has surface 723. The second substrate 722 is preferably a silicon substrate, but other semiconductor materials or a silicon substrate with other materials deposited onto the top surface 723 can be used. An adhesion layer 721 is deposited on either the surface 706, or the surface 723 of the second substrate 722, or on both. Figure D2 shows the example in which the adhesion layer 721 is deposited onto surface 723 of the second substrate 722. It is clear that any one of these three combinations may be employed without departing from the scope of the invention. The typical requirement on the adhesion layer is that it can withstand the temperatures required for later growth of synthetic diamond (around 800° C.). Such adhesion layers are also referred to as bonding layers. The structure 700 is flipped upside down onto the second substrate 722 as indicated with arrow 729 in such a way that surface the surface 706 faces the surface 723 of the second substrate 722.

FIG. 7C shows the third step D3 of Method D. In the third step D3 of Method D, the structure 730 is bonded by applying axial pressure (illustrated with arrows 732) and heat (illustrated with arrows 733). The pressure may vary from zero to 1 MPa, while typical temperatures for bonding may be around 350° C.

FIG. 7D shows the fourth step D4 of Method D. In the fourth step D4 of Method D, the silicon wafer 701 removed by chemical etching or mechanical polish or a combination thereof from the bonded structure 730 of FIG. 7C. The surface 708 of the layered structure 702 is now revealed. The new structure is denoted with 740.

Figure 7E:
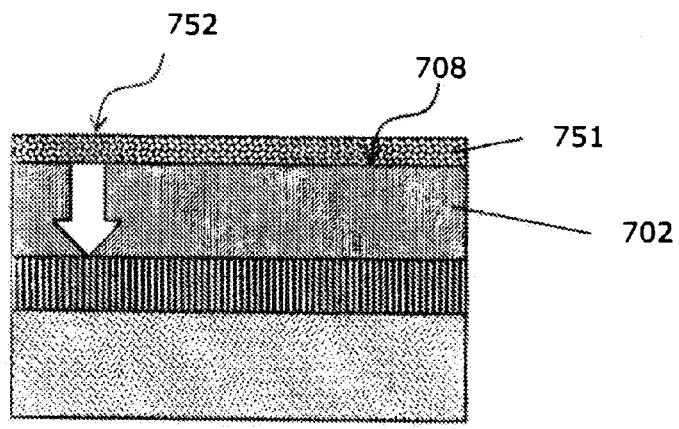

FIG. 7E shows the fifth step D5 of Method D. In the fifth step D5 of Method D, a nucleation layer 751 is formed on top surface 708 of the layered structure 702. In one embodiment, the nucleation layer 751 is formed typically by deposition of amorphous silicon nitride, silicon carbide, or aluminum nitride. The thickness of the nucleation layer depends on the material used for nucleation. It is determined typically as the thickness sufficient for the nucleation of diamond growth, and is preferably less than 150 nm. Other amorphous or polycrystalline materials mentioned previously may be used without the departing from the concept of present invention. The surface of the nucleating layer is denoted with 752. In another embodiment, the nucleation layer 751 is formed during the last step of the formation of the layered structure 702. In this latter embodiment, no additional deposition of a nucleating layer is necessary, as the surface 708 of the layered structure 702 has then been prepared for the subsequent step of growing synthetic diamond. In this case, the "nucleation layer surface" 752 means surface 708.

Figure 7F:
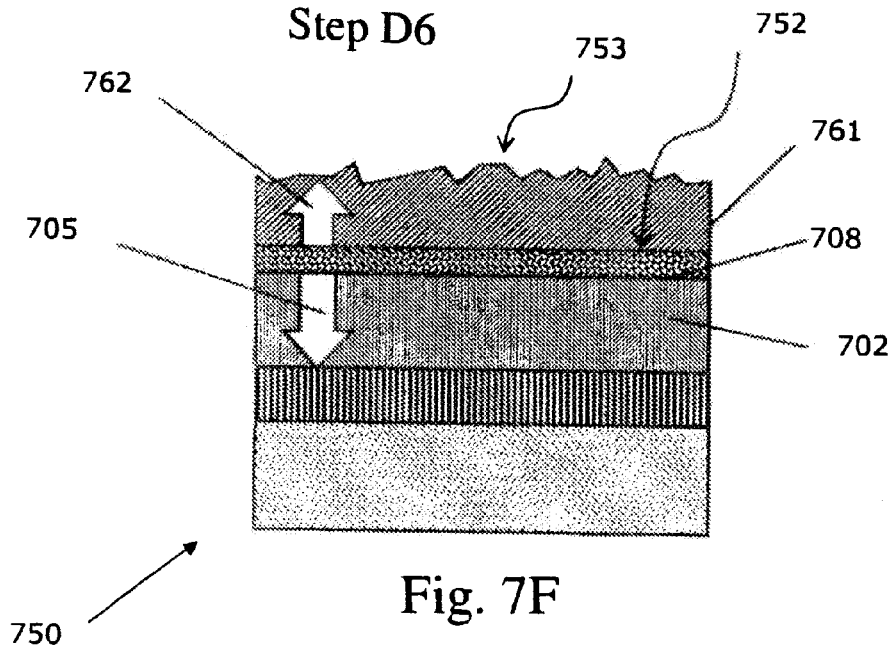

FIG. 7F shows the sixth step D6 of Method D. In the sixth step D6 of Method D, a synthetic diamond layer 761 is grown on the surface 752. The growth direction is indicated with the arrow 762. The growth direction 762 of the diamond layer 761 is the opposite from the growth direction 705 of the layered structure 702. The thickness of the diamond may vary typically from several micrometers to hundreds of micrometers depending on the application. During growth, the surface 753 of the synthetic diamond becomes rough. The completed structure is denoted with 750.

FIG. 7G shows the seventh step D7 of Method D. In the seventh step D7 of Method D, a layer of polysilicon 771 is grown on top of the surface 772 of synthetic diamond 761. The thickness of the polysilicon layer is typically greater than the diamond surface 753 bow measured over an evaluation area greater than approximately 100 square micrometers. The surface 773 of the deposited polysilicon layer 771 is also rough owing to the roughness of the underlying rough surface 772 of the diamond layer 761.

FIG. 7G also shows the eighth step D8 of Method D. In the eighth step D8 of Method D, the surface 773 of the polysilicon layer 771 is polished forming a structure 780. The rms roughness of polished polysilicon surface 783 is typically less than approximately 2 nm measured of a square with sides typically equal to approximately 100 micrometers. At the end of step D8, the bow of a 4" wafer is preferably less than approximately 100 micrometer (or a scaled value, if smaller wafers are used).

Figure 7H:
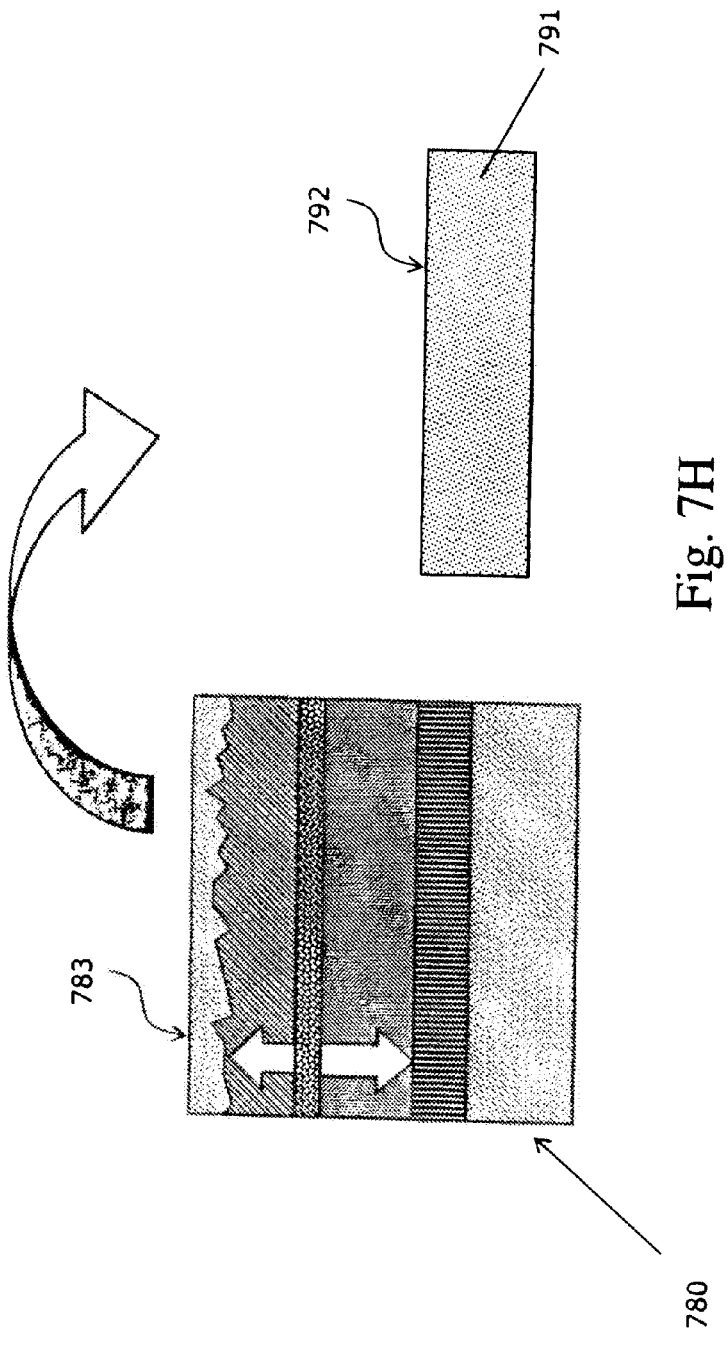

FIG. 7H shows the ninth step D9 of Method D. In the ninth step D9 of Method D, a third substrate 791 is provided. The third substrate 791 is preferably a silicon substrate, but other semiconductor materials mentioned previously or any of those substrates with other materials deposited onto their top surface 792 can be used. The requirements on the surface 792 and the third substrate 791 are that (a) the rms surface roughness (or surface 792) be typically less than approximately 2 nm measured over an approximately 100-micrometer square, (b) the third substrate 791 bow is typically less than approximately 100 micrometers on an approximately 4-inch wafer, and (c) that the surface material present on the surface 792 can be typically bonded to the polysilicon surface 783. The structure 780 is flipped upside down onto the third substrate 791 in such a way that the polished polysilicon surface 783 becomes adjacent to the surface 792 of third substrate 791.

Figure 7I:
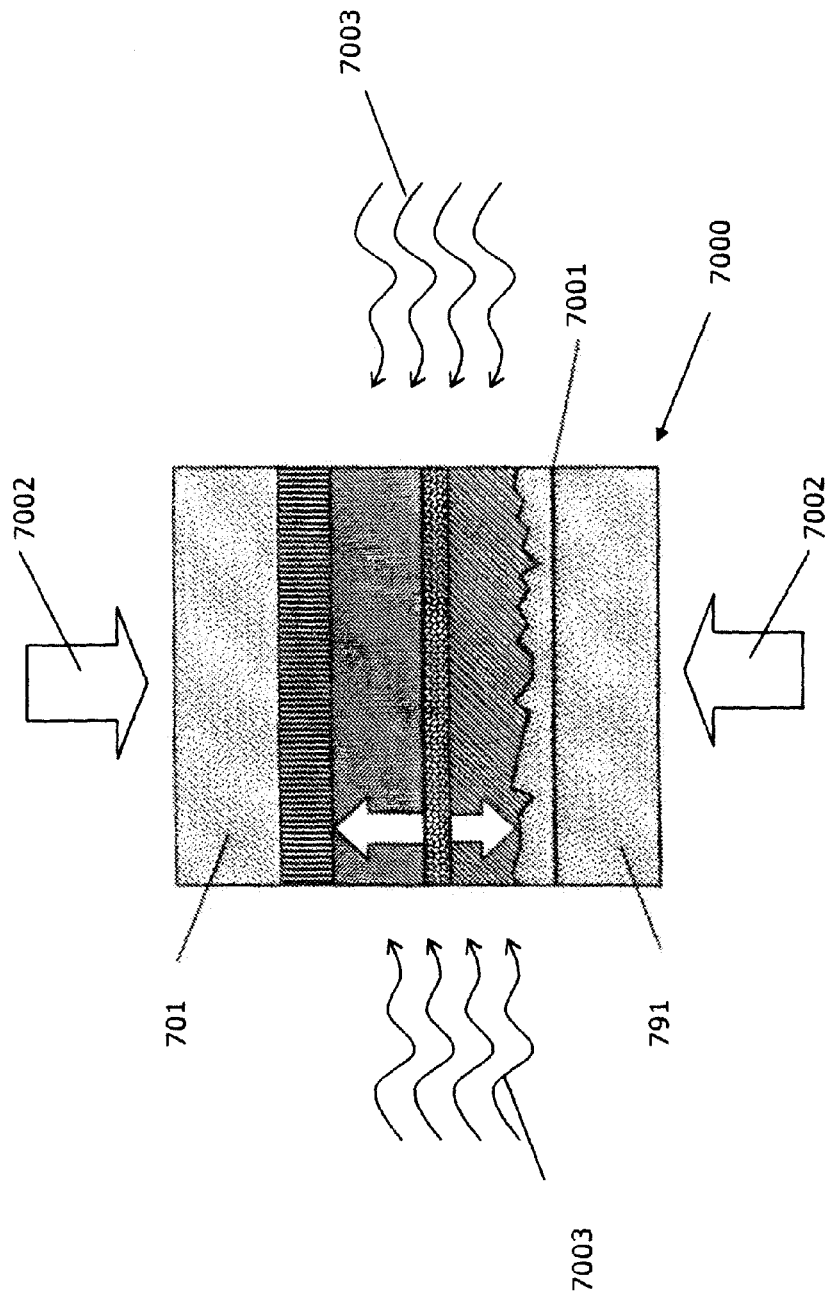

FIG. 7I shows the tenth step D10 of Method D. In the tenth step D10 of Method D, the structure 780 is bonded to the substrate 791 under axial pressure denoted with the arrows 7002 and heat illustrated with arrows 7003. The pressure typically varies from approximately zero to approximately 1 MPa, while the typical temperature for bonding silicon to silicon is around 350° C. The resulting bonded structure is denoted with 7000. The bonded interface is denoted with 7001.

Figure 7J:
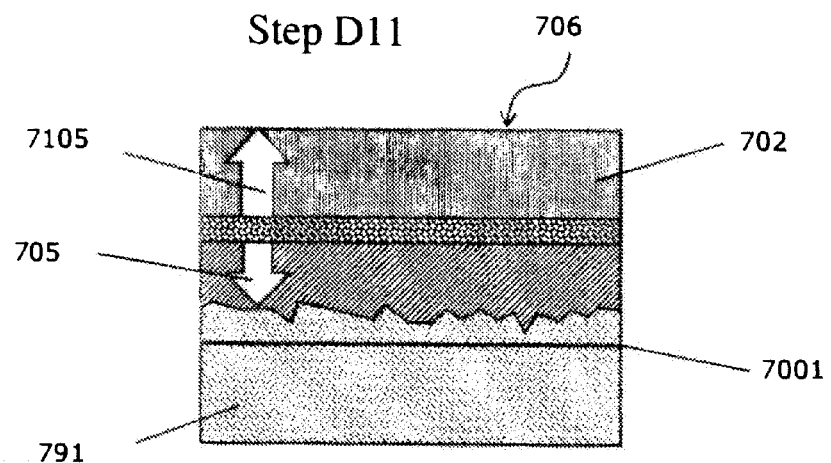

FIG. 7J shows the eleventh step D11 of Method D. In the eleventh step D11 of Method D, the silicon wafer 701 is removed by chemical etching or mechanical polish or a combination thereof from the bonded structure 7000 of 7I. The surface 706 of the layered structure 702 is now revealed and available for further processing. The growth direction 705 of synthetic diamond is opposite from layered structure growth direction 7105.

Figure 7K:
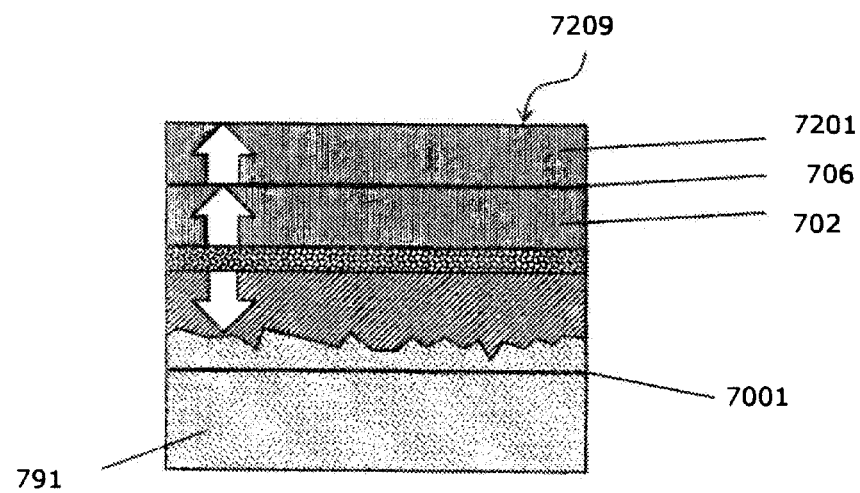

FIG. 7K shows the twelfth step D12 of Method D. In one embodiment of Method D (step D12), crystal growth of wide-gap semiconductors may be performed on the surface 706 of the layered structure 702 in order to form additional layers 7201. In this embodiment, the layered structure 702 serves as a "seed" layer for continued growth of wide-gap semiconductors. The growth of additional layers 7201 ends with surface 7209.

Figure 7L:
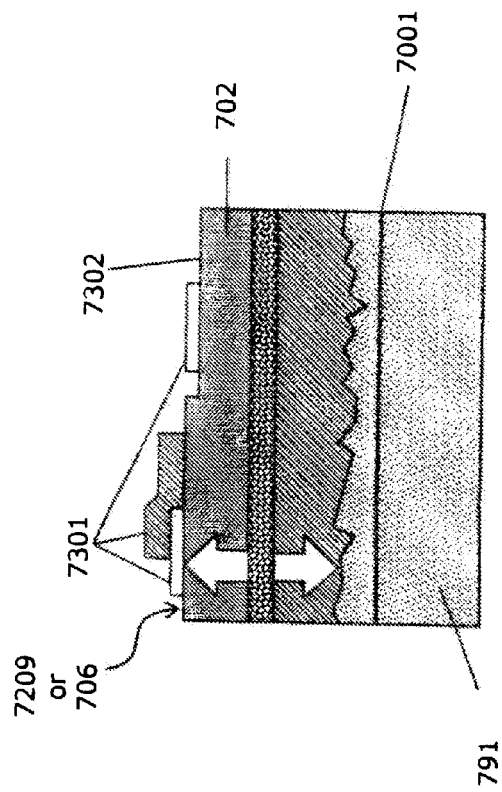

FIG. 7L shows the thirteenth step D13 of Method D. In yet another embodiment of Method D (step D13), the surface 706 of the layered structure is further processed toward making electronic or optoelectronic devices. This processing may include removing some or part of layers (illustratively shown with 7302) of the layered structure 702, depositing metals or dielectrics onto the resulting surface (illustratively shown with 7301), or any other process used in the manufacture of wide-gap semiconductor devices. Both steps D12 and D13 may occur in a process. In that case, surface 7209 may be the surface being processed in step D13 rather than surface 706.

Figure 8:
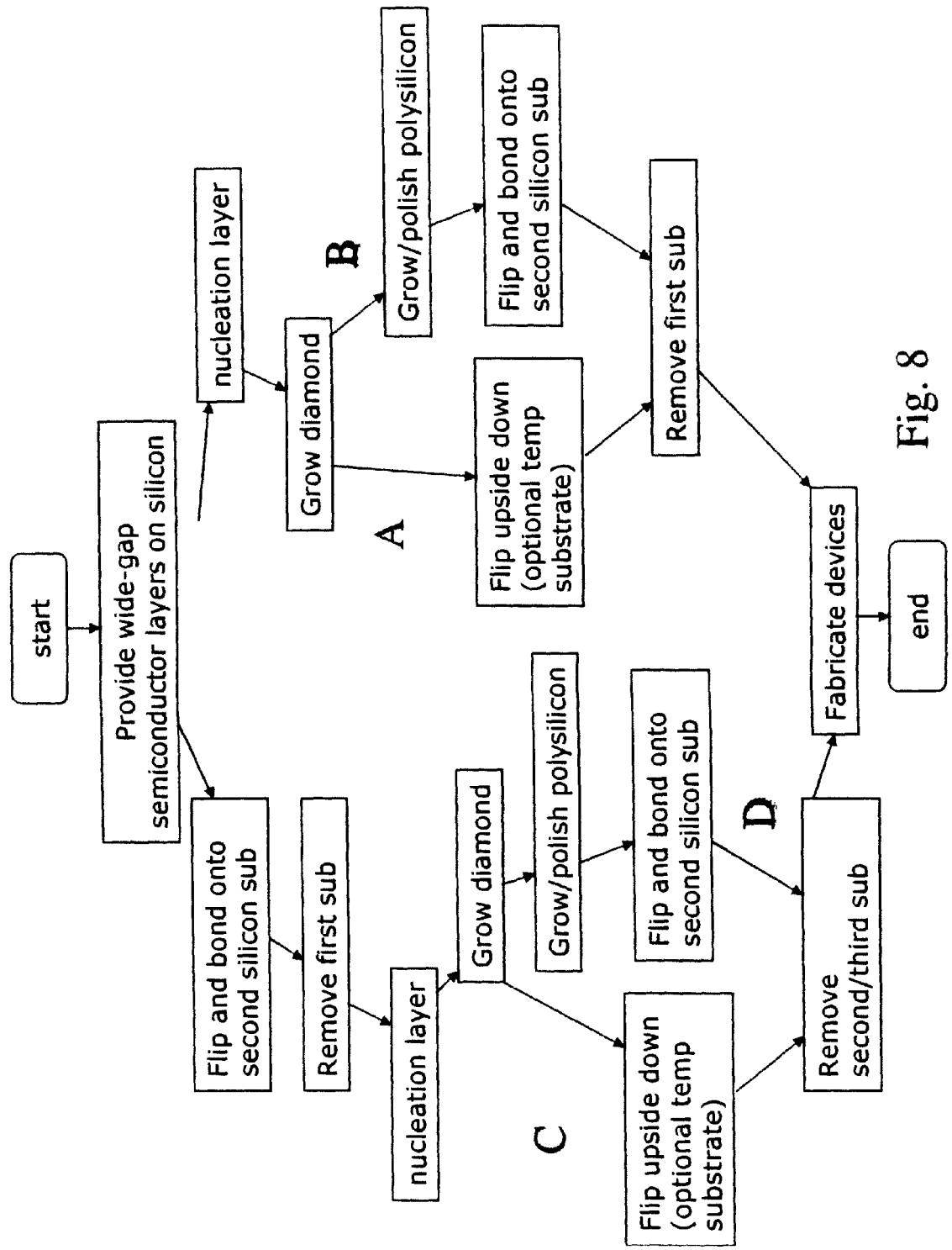
FIG. 8 shows a flow diagram for methods A, B, C, and D.

FIG. 8 shows a process flow diagram illustrating the four described methods. METHOD E. Methods A, B, C, and D, may use Method E for temporary mounting and support of diamond substrates. The Method E is described with the help of FIGS. 9A through 9E.

Figure 9A:
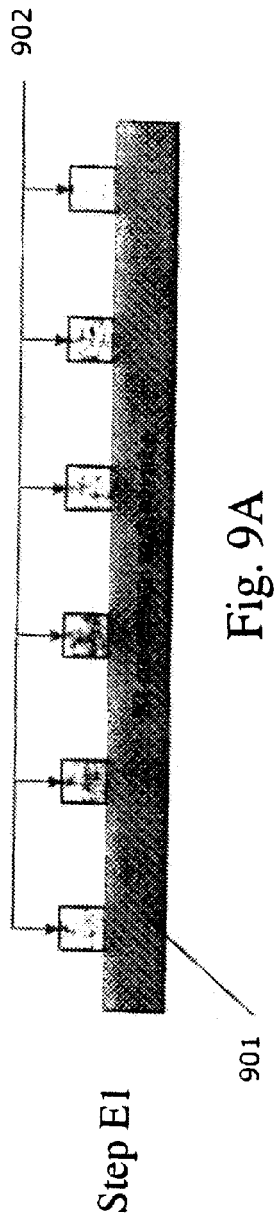
FIGS. 9A-9E illustrate Method E.

FIG. 9A shows the first step E1 of Method E. Method E is employed to provide a temporary support to a structure comprising of a layered structure made out of wide-gap semiconductors on top of a synthetic diamond. The first step E1 of Method E comprises of providing a silicon (or another type of) substrate 901 and glass-paste preformed pattern shown schematically with 902. The preform pattern 902 is deposited and patterned using standard deposition and lithographic means well known in the art. For low temperature processing, such as, photolithography, the preforms may comprise metal or polyimide, or combination thereof. A preform is a mixture of materials, in either layered or particulate form, suitable for patterning or straightforward forming for a certain use, which changes stochiometry or chemistry to get into a final form by using a defined process. For example, an eutectic mixture of metals is a preform that changes into a binary mixture once exposed to the eutectic temperature.

Figure 9E:
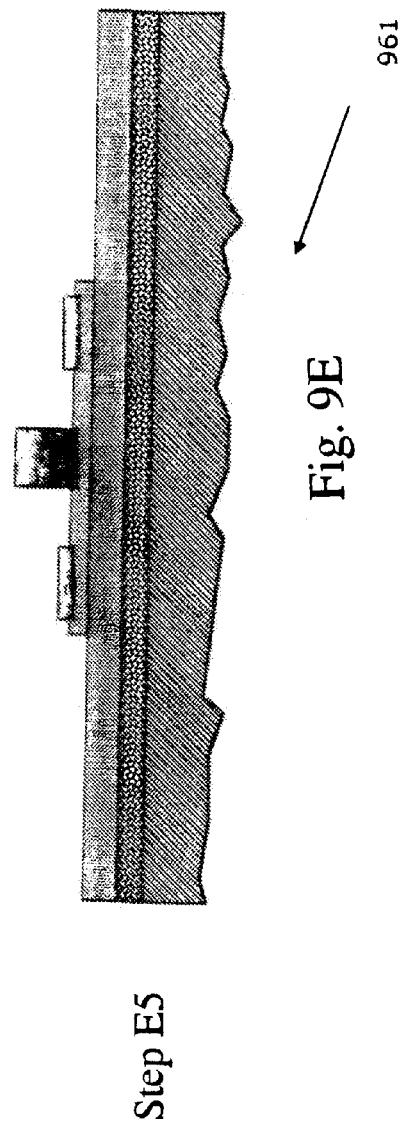
Figure 9B:
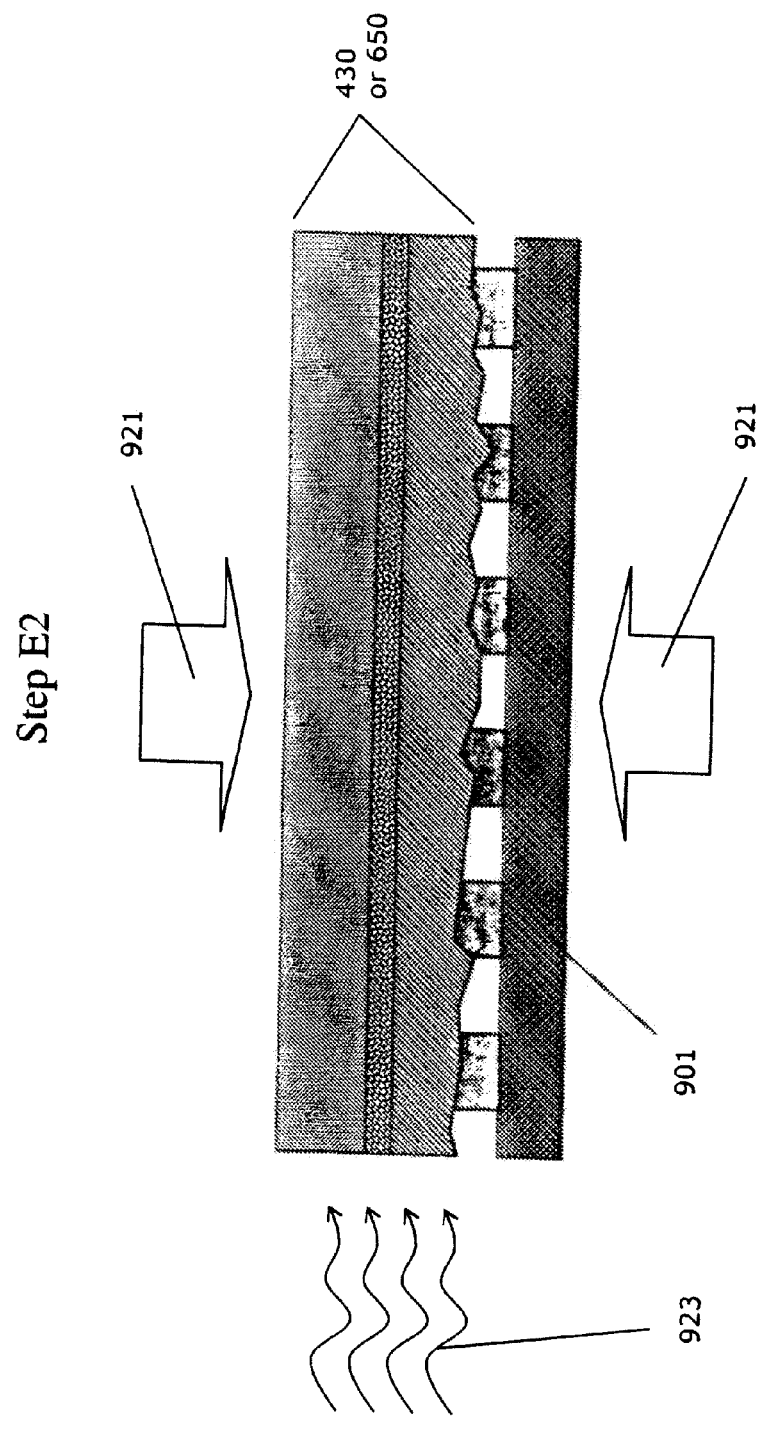

FIG. 9B shows the second step E2 of Method E. In the second step E2 of Method E, the structure 430 from Method A or structure 650 from Method C is mounted upside down on to the glass-paste preform pattern, and bonded under pressure illustrated with arrows 921 and optionally heat 923.

Figure 9C:
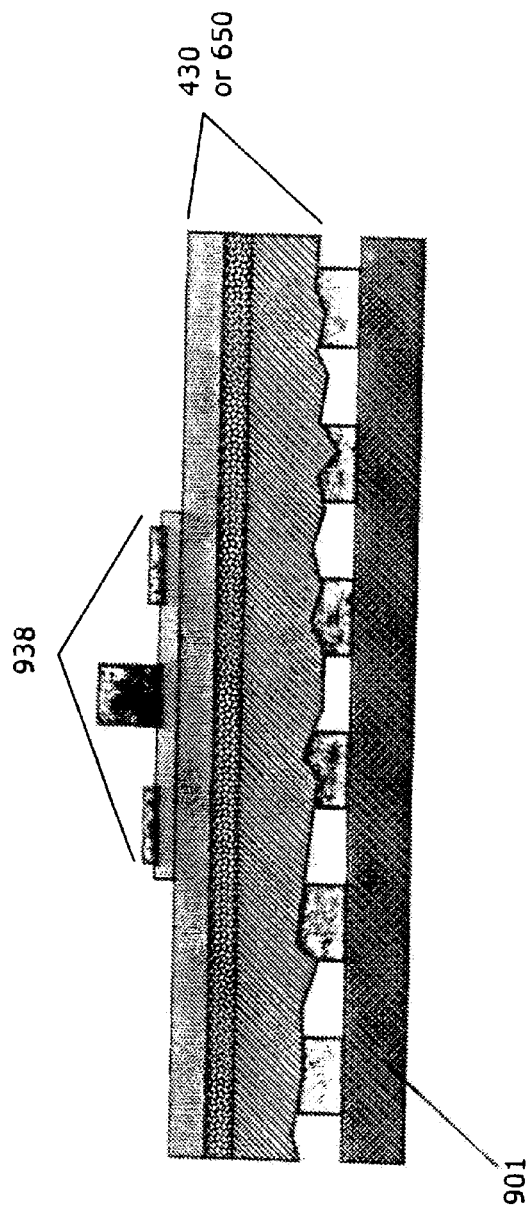

FIG. 9C shows the third step E3 of Method E. In step E3, devices 938 are manufactured on top of the layered structure (Structure 430 with wafer 401 removed at Step A4(c) or structure 650 with wafer 622 removed at Step C7(c)) comprising wide-gap semiconductors. The fabrication of devices 938 in this step is equivalent to the fabrication in steps A7 or C10.

Figure 9D:
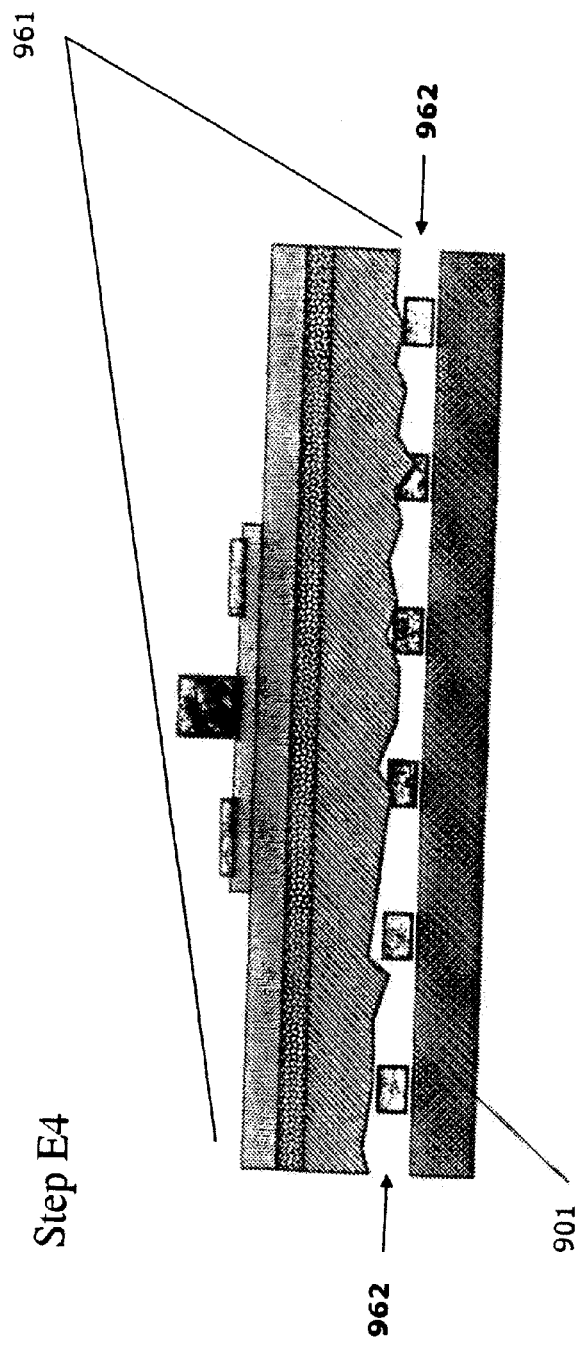

FIG. 9D shows the fourth step E4 of Method E. In step E4, the completed device wafer 961 is removed from the temporary substrate 901 using a selective etch 962.

FIG. 9E shows the fifth step E5 of the preferred Method E. In step E5, the completed device wafer 961 is available for mounting onto the final substrate.

It is apparent that the above embodiments may be altered in many ways without departing from the scope of the invention. Further, various aspects of a particular embodiment may contain patentable subject matter without regard to other aspects of the same embodiment. Additionally, various aspects of different embodiments can be combined together. Also, those skilled in the art will understand that variations can be made in the number and arrangement of components illustrated in the above diagrams. It is intended that the appended claims include such changes and modifications.

What is claimed is:

1. A method of manufacturing a semiconductor device comprising the steps of:
    (a) providing a first layered structure layer, said first layered structure layer including at least one layer including a wide-gap semiconductor material;
    (b) depositing a nucleating layer over at least a portion of said first layered structure layer, wherein said nucleating layer is formed from a material selected from the group consisting of polycrystalline material, amorphous material, and mixtures thereof;
    (c) depositing a synthetic diamond layer over said nucleating layer; and
    (d) depositing a second layered structure layer over said first layered structure layer, said second layered structure layer including at least one layer including said wide-gap semiconductor material.

2. The method of claim 1, wherein said first layered structure layer has a first growth direction, said second layered structure layer has a second growth direction opposite to the first growth direction, and said synthetic diamond layer has the first growth direction.

3. The method of claim 2, wherein said nucleation layer has the first growth direction.

4. The method of claim 1, wherein said nucleating layer includes silicon nitride.

5. The method of claim 1, wherein said nucleating layer includes atoms selected from the group consisting of silicon, nitrogen, carbon, and aluminum.

6. The method of claim 4, wherein said wide-gap semiconductor material is gallium nitride.

7. The method of claim 1, wherein said nucleating layer includes atoms selected from the group consisting of silicon, nitrogen, carbon, and aluminum.

8. The method of claim 6, wherein step (d) is performed using an epitaxial growth technique.

9. The method of claim 6, wherein said semiconductor device is selected from the group consisting of high-electron mobility transistors, super-luminescent diodes, laser diodes, and light-emitting diodes.

10. A method of manufacturing a semiconductor device comprising the steps of:
   (a) providing a wafer including a substrate layer and a first layered structure layer disposed over said substrate layer, said first layered structure layer including at least one layer including a wide-gap semiconductor material;
   (b) depositing a nucleating layer over said first layered structure layer, wherein said nucleating layer is formed from a material selected from the group consisting of polycrystalline material, amorphous material, and mixtures thereof;
   (c) depositing a synthetic diamond layer over said nucleating layer; and
   (d) removing said substrate layer.

11. The method of claim 10, wherein said nucleating layer includes silicon nitride.

12. The method of claim 10, wherein said nucleating layer includes polycrystalline silicon.

13. The method of claim 11, wherein said wide-gap semiconductor material is gallium nitride.

14. The method of claim 13, further comprising the steps of:
   (e) removing a part of said first layered structure layer; and
   (f) depositing at least one metal contact on the remaining first layered structure layer.

15. The method of claim 10, wherein said nucleating layer includes atoms selected from the group consisting of silicon, nitrogen, carbon, and aluminum.

16. The method of claim 14, wherein said semiconductor device is selected from the group consisting of high-electron mobility transistors, super-luminescent diodes, laser diodes, and light-emitting diodes.

17. The method of claim 13, further comprising the steps of:
   (e) removing a part of said first layered structure layer; and
   (f) epitaxially growing a second layered structure layer over said first layered structure layer, said second layered structure including at least one layer formed of said wide-gap semiconductor material.

18. The method of claim 17, further comprising the step of depositing at least one metal contact on the remaining second layered structure layer.

19. The method of claim 18, wherein said semiconductor device is selected from the group consisting of high-electron mobility transistors, semiconductor lasers, super-luminescent diodes, and light-emitting diodes.

20. The method of claim 17, wherein said first layered structure layer has a first growth direction, said second layered structure layer has a second growth direction opposite to the first growth direction, and said synthetic diamond layer has the first growth direction.

21. The method of claim 20, wherein said nucleating layer has the first growth direction.

22. The method of claim 1, wherein said nucleating layer is polycrystalline silicon.

* * * * *